United States Patent
Kim et al.

(10) Patent No.: US 10,431,628 B2
(45) Date of Patent: Oct. 1, 2019

(54) DUAL CHANNEL/GATE VERTICAL FIELD-EFFECT TRANSISTOR (FET) FOR USE WITH A PERPENDICULAR MAGNETIC TUNNEL JUNCTION (PMTJ)

(71) Applicant: Spin Memory, Inc., Fremont, CA (US)

(72) Inventors: Kuk-Hwan Kim, San Jose, CA (US);
Marcin Gajek, Berkeley, CA (US);
Dafna Beery, Palo Alto, CA (US);
Amitay Levi, Cupertino, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 15/866,381

(22) Filed: Jan. 9, 2018

(65) Prior Publication Data

US 2019/0214432 A1   Jul. 11, 2019

(51) Int. Cl.
*H01L 43/12* (2006.01)
*H01L 27/22* (2006.01)
*H01L 29/66* (2006.01)
*H01L 43/02* (2006.01)
*H01L 29/78* (2006.01)
*H01L 29/772* (2006.01)

(52) U.S. Cl.
CPC ...... *H01L 27/228* (2013.01); *H01L 29/66666* (2013.01); *H01L 29/7727* (2013.01); *H01L 29/7827* (2013.01); *H01L 43/02* (2013.01); *H01L 43/12* (2013.01)

(58) Field of Classification Search
CPC ... H01L 43/12; H01L 29/7727; H01L 27/228; H01L 27/2454; H01L 29/7827
See application file for complete search history.

(56) References Cited

U.S. PATENT DOCUMENTS

| | | | |
|---|---|---|---|
| 2007/0029586 A1* | 2/2007 | Orlowski | B82Y 10/00 257/287 |
| 2010/0117138 A1* | 5/2010 | Huerta | B82Y 10/00 257/324 |
| 2011/0012085 A1* | 1/2011 | Deligianni | B82Y 10/00 257/9 |
| 2011/0017971 A1* | 1/2011 | Kim | H01L 27/10876 257/5 |
| 2012/0241826 A1* | 9/2012 | Satoh | H01L 27/228 257/295 |

(Continued)

*Primary Examiner* — Kimberly N Rizkallah
*Assistant Examiner* — Gustavo G Ramallo
(74) *Attorney, Agent, or Firm* — Zilka-Kotab, P.C.

(57) ABSTRACT

According to one embodiment, a method includes forming a drain contact above a channel, each having a hollow circular cross-section thereof along a plane perpendicular to a film thickness direction, forming gate dielectric layers on sides of the drain contact and the channel, forming a source line positioned below the channel that is electrically coupled to a plurality of channels in a direction along the plane, forming gate layers on sides of the gate dielectric layers, where an inner gate layer fills a hole through a center of a center concentric circular cross-section of the gate dielectric layers along the plane, and where an outer gate layer surrounds an outside concentric circular cross-section of the gate dielectric layers along the plane, forming an electrode above the upper surface of the drain contact, and forming a fourth insulative layer on sides of the electrode along the plane.

15 Claims, 22 Drawing Sheets

(56) References Cited

U.S. PATENT DOCUMENTS

2013/0244344 A1* 9/2013 Malmhall .............. B82Y 10/00
　　　　　　　　　　　　　　　　　　　　　　438/3
2015/0364603 A1* 12/2015 Cheng ................ H01L 29/7851
　　　　　　　　　　　　　　　　　　　　　　257/192

* cited by examiner

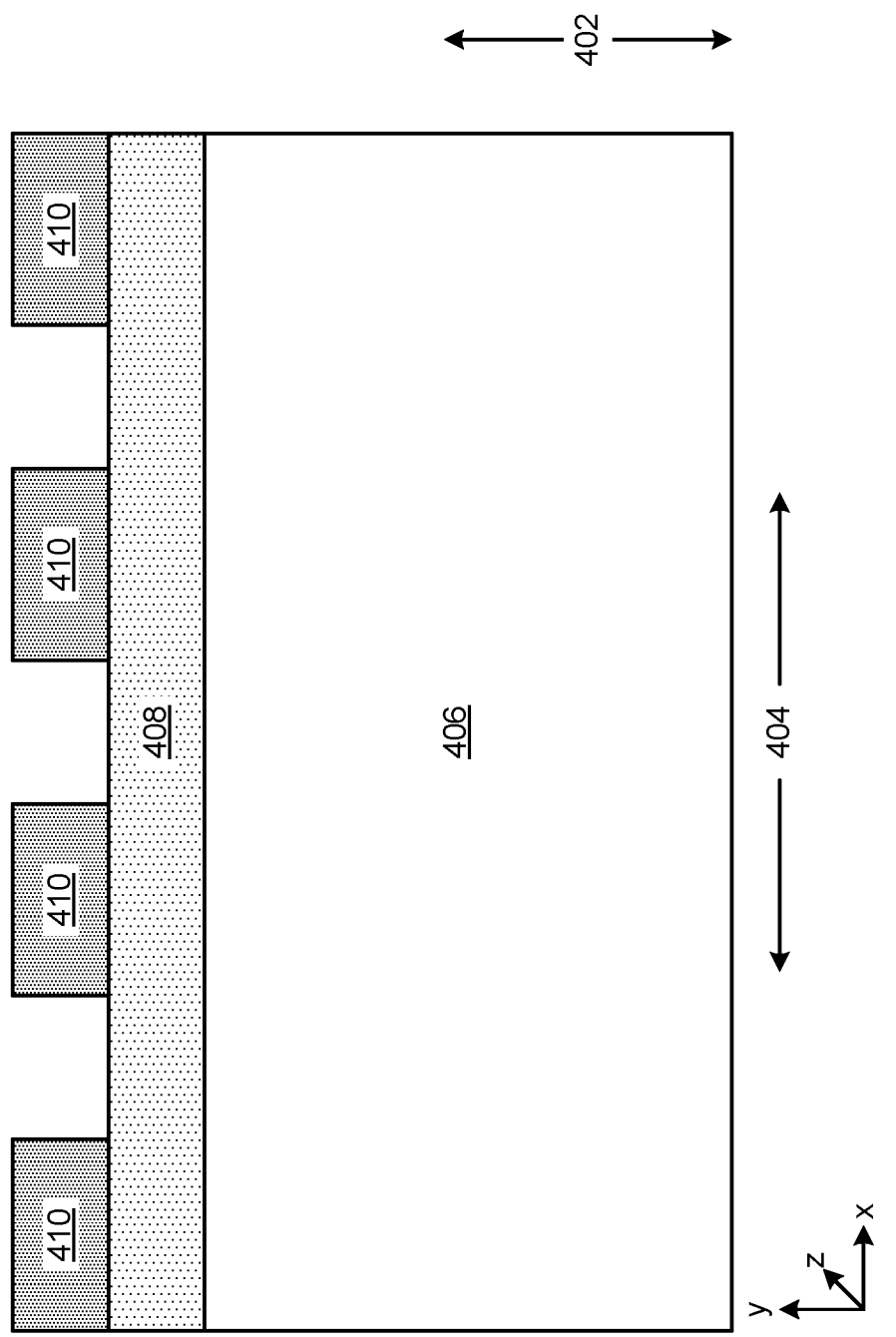

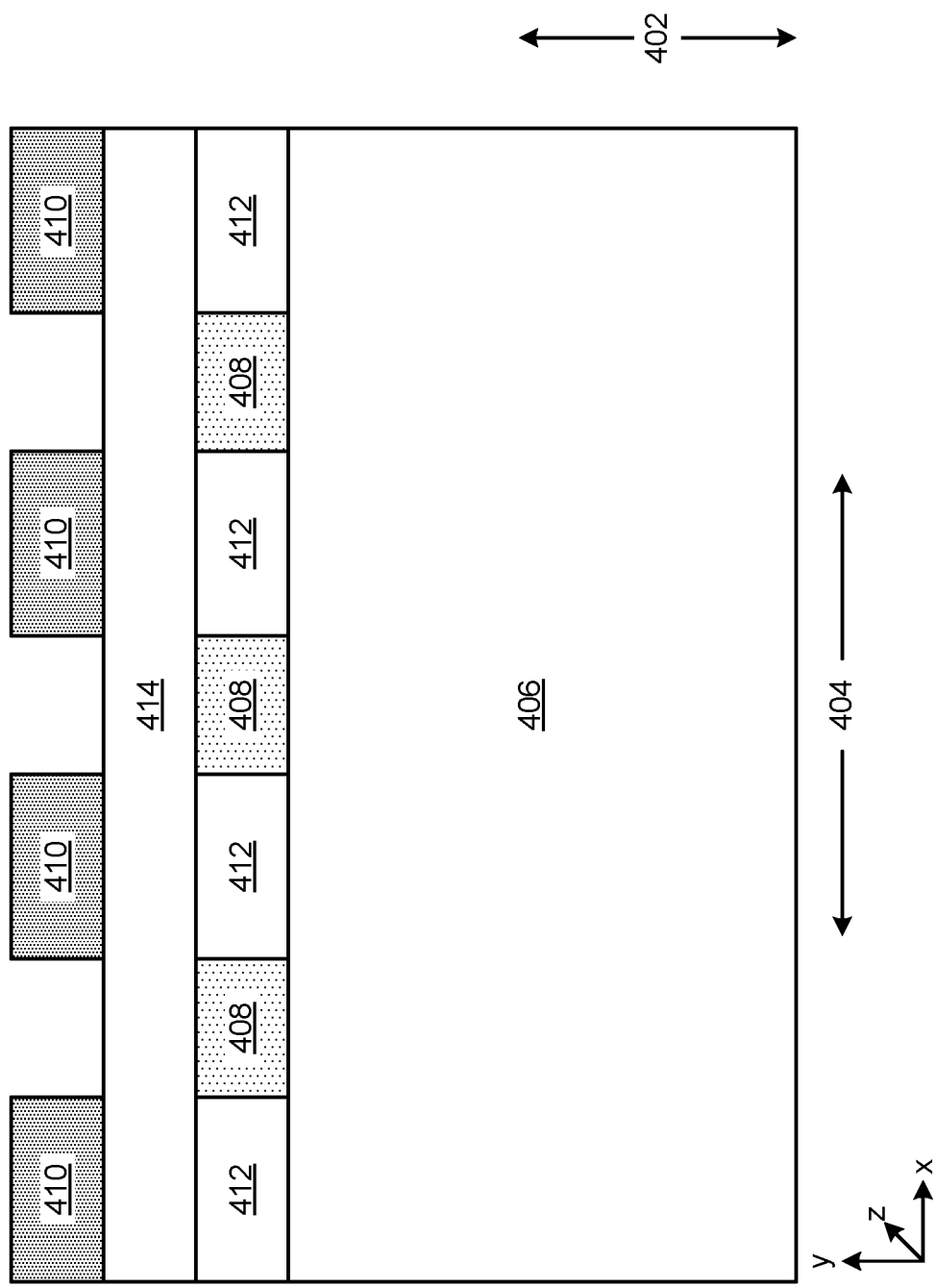

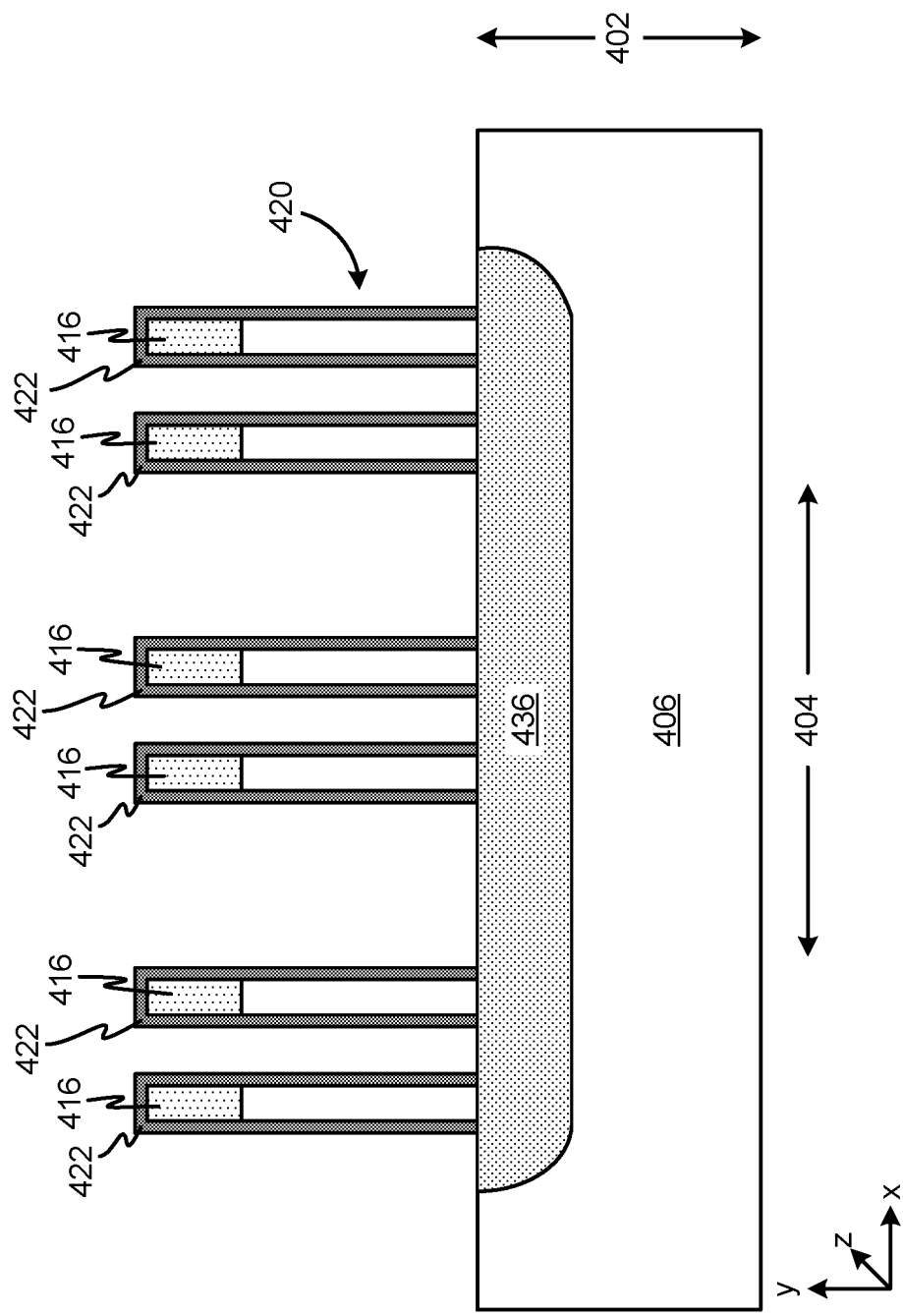

DUAL CHANNEL/GATE VERTICAL FIELD-EFFECT TRANSISTOR (FET) FOR USE WITH A PERPENDICULAR MAGNETIC TUNNEL JUNCTION (PMTJ)

FIELD OF THE INVENTION

The present invention relates to magnetic random access memory (MRAM), and more particularly to providing a dual channel/gate vertical field-effect transistor (FET) used with a perpendicular magnetic tunnel junction (pMTJ).

BACKGROUND

Magnetic Random Access Memory (MRAM) is a non-volatile data memory technology that stores data using magnetoresistive cells, such as Magnetoresistive Tunnel Junction (MTJ) elements. At their most basic level, such MTJ elements include first and second magnetic layers that are separated by a thin, non-magnetic tunnel barrier layer, which may be constructed of an insulating barrier material, such as MgO, $Al_2O_3$, etc. The first magnetic layer, which may be referred to as a reference layer, has a magnetization that is fixed in a direction that is perpendicular to that of a plane of the layer. The second magnetic layer has a magnetization that is free to move so that it may be oriented in either of two directions that are both generally perpendicular to the plane of the free magnetic layer. Therefore, the magnetization of the free layer may be either parallel with the magnetization of the reference layer or anti-parallel with the direction of the reference layer (i.e., opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. Each electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free layer and the reference layer are oriented in the same direction, the spin of the electrons in the free layer are generally in the same direction as the orientation of the spin of the electrons in the reference layer. Because these electron spins are generally in the same direction, the electrons may pass relatively easily through the tunnel barrier layer. However, if the orientations of the magnetizations of the free layer and the reference layer are opposite to one another, the spin of electrons in the free layer will generally be opposite to the spin of electrons in the reference layer. In this case, electrons do not easily pass through the barrier layer, resulting in a higher electrical resistance through the MTJ stack.

Because the MTJ element may be switched between low and high electrical resistance states, it may be used as a memory element to store data. For example, the low resistance state may be read as a "1" or one, whereas the high resistance state may be read as a "0" or zero. In addition, because the magnetic orientation of the magnetic free layer remains in its switched state without any electrical power being provided to the element, the memory storage provided by the MTJ element is robust and non-volatile.

To write a bit of data to the MTJ cell, the magnetic orientation of the magnetic free layer is switched from a first direction to a second direction that is 180° from the first direction. This may be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation.

Once the magnetization of the free layer has been switched by the current, the state of the MTJ element may be read by detecting a voltage across the MTJ element, thereby determining whether the MTJ element is in a "1" or "0" bit state. Advantageously, once the switching electrical current has been removed, the magnetic state of the free layer will remain in the switched orientation until some other time when an electrical current is applied to switch the MTJ element to the opposite state. Therefore, the recorded data bit is non-volatile in that it remains intact (the magnetic orientation of the free layer does not change) in the absence of any electrical current being supplied.

SUMMARY

According to one embodiment, a method includes forming a drain material above a substrate in a film thickness direction, forming and patterning a first masking layer above the drain material in the film thickness direction, the first masking layer being patterned to expose a portion of the drain material having a circular cross-section along a plane perpendicular to the film thickness direction, removing all portions of the drain material except for the exposed portion of the drain material and portions positioned directly therebelow in the film thickness direction using the first masking layer, removing the first masking layer during or after removal of the portions of the drain material, forming a first insulative layer above portions of the substrate not covered by the drain material to a thickness consistent with an upper surface of the drain material, forming a second insulative layer above the first insulative layer and the drain material in the film thickness direction to a desired thickness, placing the first masking layer above the second insulative layer aligned with previous placement of the first masking layer above the substrate to expose a portion of the second insulative layer having the circular cross-section along the plane perpendicular to the film thickness direction, removing the exposed portion of the second insulative layer to expose the upper surface of the drain material, removing the first masking layer during or after removal of the exposed portion of the second insulative layer, growing the second insulative layer along the plane perpendicular to the film thickness direction to shrink a diameter of a hole through the second insulative layer having the circular cross-section along the plane perpendicular to the film thickness direction, removing exposed portions of the drain material through the hole of the second insulative layer to form a drain contact having a circular cross-sectional hole in a center thereof along the plane perpendicular to the film thickness direction, removing the first insulative layer and the second insulative layer, removing portions of the substrate positioned directly below the drain contact to a desired level in the film thickness direction to form a channel having the circular cross-section with a hole in a center thereof along the plane perpendicular to the film thickness direction, forming gate dielectric layers above the drain contact and on sides of the drain contact and the channel, the gate dielectric layers having concentric circular cross-sections along the plane perpendicular to the film thickness direction, where the circular cross-section of the drain contact has one circular cross-sectional portion of the gate dielectric layers in direct contact on either side thereof, forming a source layer below the channel in the film thickness direction, the source layer being electrically coupled to the channel, forming and patterning a second masking layer above the gate dielectric layers positioned above the drain contact and above the hole in the center of the drain contact in the film thickness direction, where the second masking layer has a rectangular cross-section along the plane perpendicular to the film thickness direction that is positioned above a plurality of drain contacts, removing portions of the source layer and substrate not covered by the second masking layer in the film thickness direction to form a source line that is electrically coupled to a plurality of channels along the plane perpendicular to the film thickness direction, removing the second masking layer, forming a third insulative layer having a thickness in the film thickness direction that corresponds to a desired height of a lower surface of subsequently formed gate layers, forming the gate layers above the third insulative layer on sides of the gate dielectric layers to a thickness coincident with a lower surface of the drain contact in the film thickness direction, where an inner gate layer fills a hole through a center of a center concentric circular cross-section of the gate dielectric layers along the plane perpendicular to the film thickness direction, and where an outer gate layer surrounds an outside concentric circular cross-section of the gate dielectric layers along the plane perpendicular to the film thickness direction, removing an upper portion of the gate dielectric layers above the drain contact to expose an upper surface of the drain contact, forming an electrode above the upper surface of the drain contact, and forming a fourth insulative layer above the third insulative layer and the gate layers in the film thickness direction, and along sides of the electrode along the plane perpendicular to the film thickness direction.

In another embodiment, a method includes forming a drain contact and a channel, where the drain contact is positioned above the channel in a film thickness direction, and where the drain contact and the channel have a circular cross-sectional hole in a center of a circular cross-section thereof along a plane perpendicular to the film thickness direction, forming gate dielectric layers on sides of the drain contact and the channel, the gate dielectric layers having concentric circular cross-sections along the plane perpendicular to the film thickness direction, where the circular cross-section of the drain contact has one circular cross-sectional portion of the gate dielectric layers in direct contact on either side thereof, forming a source line positioned below the channel in the film thickness direction, where the source line is electrically coupled to a plurality of channels in a direction along the plane perpendicular to the film thickness direction, forming gate layers on sides of the gate dielectric layers, the gate layers having a lower surface at a level above an upper surface of the source line and a thickness coincident with a lower surface of the drain contact in the film thickness direction, where an inner gate layer fills a hole through a center of a center concentric circular cross-section of the gate dielectric layers along the plane perpendicular to the film thickness direction, and where an outer gate layer surrounds an outside concentric circular cross-section of the gate dielectric layers along the plane perpendicular to the film thickness direction, forming an electrode above the upper surface of the drain contact, and forming a fourth insulative layer on sides of the gate layers, sides of the gate dielectric layers, and sides of the electrode along the plane perpendicular to the film thickness direction.

In accordance with another embodiment, an apparatus includes a drain contact positioned above a channel in a film thickness direction, where the drain contact and the channel have a circular cross-sectional hole in a center of a circular cross-section thereof along a plane perpendicular to the film thickness direction, gate dielectric layers positioned on sides of the drain contact and on sides of the channel, the gate dielectric layers having concentric circular cross-sections along the plane perpendicular to the film thickness direction, where the circular cross-section of the drain contact has one circular cross-sectional portion of the gate dielectric layers in direct contact on either side thereof, a source line positioned below the channel in the film thickness direction, where the source line is electrically coupled to the channel and is configured to electrically couple to a plurality of additional channels in a direction along the plane perpendicular to the film thickness direction, gate layers positioned on sides of the gate dielectric layers, the gate layers having a lower surface at a level above an upper surface of the source line and a thickness coincident with a lower surface of the drain contact in the film thickness direction, where an inner gate layer fills a hole through a center of a center concentric circular cross-section of the gate dielectric layers along the plane perpendicular to the film thickness direction, and where an outer gate layer surrounds an outside concentric circular cross-section of the gate dielectric layers along the plane perpendicular to the film thickness direction, an electrode positioned above the upper surface of the drain contact, and a fourth insulative layer positioned on sides of the gate layers, sides of the gate dielectric layers, and sides of the electrode along the plane perpendicular to the film thickness direction.

These and other features and advantages of the invention will be apparent to one of skill in the art upon reading of the following detailed description of the embodiments in conjunction with the figures. In the figures, like reference numerals used in more than one figure indicate a like element, and may be considered in light of the description of the like element presented in any of the other figures having the like element.

BRIEF DESCRIPTION OF THE DRAWINGS

For a fuller understanding of the nature and advantages of this invention, as well as the preferred mode of use, reference should be made to the following detailed description read in conjunction with the accompanying drawings. The drawings are not presented to scale unless specified otherwise on an individual basis.

DETAILED DESCRIPTION

Figure 1:
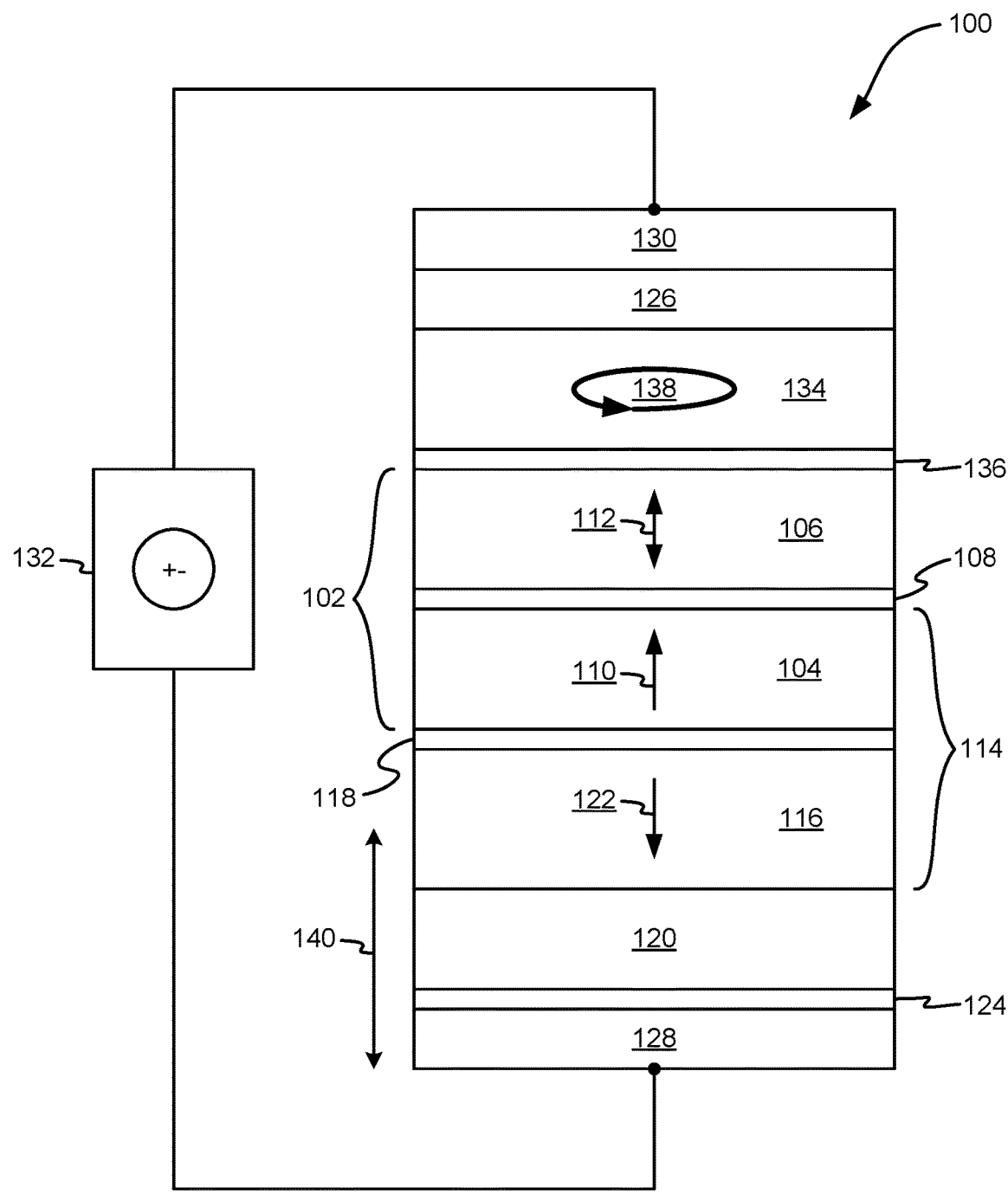
FIG. 1 is a schematic, cross-sectional view of a portion of a magnetic memory element, which may be used in embodiments of the invention.

The following description includes the best embodiments presently contemplated for carrying out the invention. This description is made for the purpose of illustrating the general principles of this invention and is not meant to limit the inventive concepts claimed herein in any way.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an," and "the" include plural referents unless otherwise specified.

Moreover, the term "about" when used herein to modify a value indicates a range that includes the value and less and greater than the value within a reasonable range. In the absence of any other indication, this reasonable range is plus and minus 10% of the value. For example, "about 10 nanometers" indicates 10 nm±1 nm, such that the range includes all values in a range including 9 nm up to and including 11 nm.

Also, the term "comprise" indicates an inclusive list of those elements specifically described without exclusion of any other elements. For example, "a list comprises red and green" indicates that the list includes, but is not limited to, red and green. Therefore, the list may also include other colors not specifically described.

According to one general embodiment, a method includes forming a drain material above a substrate in a film thickness direction, forming and patterning a first masking layer above the drain material in the film thickness direction, the first masking layer being patterned to expose a portion of the drain material having a circular cross-section along a plane perpendicular to the film thickness direction, removing all portions of the drain material except for the exposed portion of the drain material and portions positioned directly therebelow in the film thickness direction using the first masking layer, removing the first masking layer during or after removal of the portions of the drain material, forming a first insulative layer above portions of the substrate not covered by the drain material to a thickness consistent with an upper surface of the drain material, forming a second insulative layer above the first insulative layer and the drain material in the film thickness direction to a desired thickness, placing the first masking layer above the second insulative layer aligned with previous placement of the first masking layer above the substrate to expose a portion of the second insulative layer having the circular cross-section along the plane perpendicular to the film thickness direction, removing the exposed portion of the second insulative layer to expose the upper surface of the drain material, removing the first masking layer during or after removal of the exposed portion of the second insulative layer, growing the second insulative layer along the plane perpendicular to the film thickness direction to shrink a diameter of a hole through the second insulative layer having the circular cross-section along the plane perpendicular to the film thickness direction, removing exposed portions of the drain material through the hole of the second insulative layer to form a drain contact having a circular cross-sectional hole in a center thereof along the plane perpendicular to the film thickness direction, removing the first insulative layer and the second insulative layer, removing portions of the substrate positioned directly below the drain contact to a desired level in the film thickness direction to form a channel having the circular cross-section with a hole in a center thereof along the plane perpendicular to the film thickness direction, forming gate dielectric layers above the drain contact and on sides of the drain contact and the channel, the gate dielectric layers having concentric circular cross-sections along the plane perpendicular to the film thickness direction, where the circular cross-section of the drain contact has one circular cross-sectional portion of the gate dielectric layers in direct contact on either side thereof, forming a source layer below the channel in the film thickness direction, the source layer being electrically coupled to the channel, forming and patterning a second masking layer above the gate dielectric layers positioned above the drain contact and above the hole in the center of the drain contact in the film thickness direction, where the second masking layer has a rectangular cross-section along the plane perpendicular to the film thickness direction that is positioned above a plurality of drain contacts, removing portions of the source layer and substrate not covered by the second masking layer in the film thickness direction to form a source line that is electrically coupled to a plurality of channels along the plane perpendicular to the film thickness direction, removing the second masking layer, forming a third insulative layer having a thickness in the film thickness direction that corresponds to a desired height of a lower surface of subsequently formed gate layers, forming the gate layers above the third insulative layer on sides of the gate dielectric layers to a thickness coincident with a lower surface of the drain contact in the film thickness direction, where an inner gate layer fills a hole through a center of a center concentric circular cross-section of the gate dielectric layers along the plane perpendicular to the film thickness direction, and where an outer gate layer surrounds an outside concentric circular cross-section of the gate dielectric layers along the plane perpendicular to the film thickness direction, removing an upper portion of the gate dielectric layers above the drain contact to expose an upper surface of the drain contact, forming an electrode above the upper surface of the drain contact, and forming a fourth insulative layer above the third insulative layer and the gate layers in the film thickness direction, and along sides of the electrode along the plane perpendicular to the film thickness direction.

In another general embodiment, a method includes forming a drain contact and a channel, where the drain contact is positioned above the channel in a film thickness direction, and where the drain contact and the channel have a circular cross-sectional hole in a center of a circular cross-section thereof along a plane perpendicular to the film thickness direction, forming gate dielectric layers on sides of the drain contact and the channel, the gate dielectric layers having concentric circular cross-sections along the plane perpendicular to the film thickness direction, where the circular cross-section of the drain contact has one circular cross-sectional portion of the gate dielectric layers in direct contact on either side thereof, forming a source line positioned below the channel in the film thickness direction, where the source line is electrically coupled to a plurality of channels in a direction along the plane perpendicular to the film thickness direction, forming gate layers on sides of the gate dielectric layers, the gate layers having a lower surface at a level above an upper surface of the source line and a thickness coincident with a lower surface of the drain contact in the film thickness direction, where an inner gate layer fills a hole through a center of a center concentric circular cross-section of the gate dielectric layers along the plane perpendicular to the film thickness direction, and where an outer gate layer surrounds an outside concentric circular cross-section of the gate dielectric layers along the plane perpendicular to the film thickness direction, forming an electrode above the upper surface of the drain contact, and forming a fourth insulative layer on sides of the gate layers, sides of the gate dielectric layers, and sides of the electrode along the plane perpendicular to the film thickness direction.

In accordance with another general embodiment, an apparatus includes a drain contact positioned above a channel in a film thickness direction, where the drain contact and the channel have a circular cross-sectional hole in a center of a circular cross-section thereof along a plane perpendicular to the film thickness direction, gate dielectric layers positioned on sides of the drain contact and on sides of the channel, the gate dielectric layers having concentric circular cross-sections along the plane perpendicular to the film thickness direction, where the circular cross-section of the drain contact has one circular cross-sectional portion of the gate dielectric layers in direct contact on either side thereof, a source line positioned below the channel in the film thickness direction, where the source line is electrically coupled to the channel and is configured to electrically couple to a plurality of additional channels in a direction along the plane perpendicular to the film thickness direction, gate layers positioned on sides of the gate dielectric layers, the gate layers having a lower surface at a level above an upper surface of the source line and a thickness coincident with a lower surface of the drain contact in the film thickness direction, where an inner gate layer fills a hole through a center of a center concentric circular cross-section of the gate dielectric layers along the plane perpendicular to the film thickness direction, and where an outer gate layer surrounds an outside concentric circular cross-section of the gate dielectric layers along the plane perpendicular to the film thickness direction, an electrode positioned above the upper surface of the drain contact, and a fourth insulative layer positioned on sides of the gate layers, sides of the gate dielectric layers, and sides of the electrode along the plane perpendicular to the film thickness direction.

Referring to FIG. 1, a magnetic memory element 100 is shown according to one embodiment. The memory element 100 may be used in a perpendicular magnetic tunnel junction (pMTJ) memory element, as described in various embodiments herein. The memory element 100 may include a magnetic tunnel junction (MTJ) 102 that may include a magnetic reference layer 104, a magnetic free layer 106, and a thin, non-magnetic, electrically-insulating magnetic barrier layer 108 positioned between the reference layer 104 and the free layer 106 in a film thickness direction 140. The barrier layer 108 may include an oxide, such as MgO, $Al_2O_3$, etc., or some other suitable material known in the art. The reference layer 104 has a magnetization 110 that is fixed in a direction that is perpendicular to a horizontal plane of the layer, as indicated by the arrow. The horizontal plane is sometimes referred to as a plane of formation in the embodiments described herein. The free layer 106 has a magnetization 112 that may be in either of two directions perpendicular to a horizontal plane of the free layer 106, as indicated by the two arrows. While the magnetization 112 of the free layer 106 remains in either of two directions perpendicular to the plane of the free layer 106 in a quiescent state, it may be selectable switched between these two directions, as is described in greater detail herein. When the magnetization 112 of the free layer 106 is in the same direction as the magnetization 110 of the reference layer 104, the electrical resistance across the MTJ 102 is at a low resistance state. Conversely, when the magnetization 112 of the free layer 106 is opposite to the magnetization 110 of the reference layer 104, the electrical resistance across the MTJ 102 is in a high resistance state.

The reference layer 104 may be part of an anti-parallel magnetic pinning structure 114 that may include a magnetic pinned layer 116 and a non-magnetic, antiparallel coupling layer 118 positioned between the pinned layer 116 and the reference layer 104 in the film thickness direction 140. The antiparallel coupling layer 118 may comprise any suitable material known in the art, such as Ru, and may be constructed to have a thickness that causes ferromagnetic antiparallel coupling of the pinned layer 116 and the reference layer 104.

In one approach, the pinned layer 116 may be exchange coupled with an antiferromagnetic layer 120, which may comprise any suitable material known in the art, such as IrMn. Exchange coupling between the antiferromagnetic layer 120 and the pinned layer 116 strongly pins the magnetization 122 of the pinned layer 116 in a first direction. The antiparallel coupling between the pinned layer 116 and the reference layer 104 pins the magnetization 110 of the reference layer 104 in a second direction opposite to the direction of magnetization 122 of the pinned layer 116.

According to one approach, a seed layer 124 may be positioned below the pinned layer 116 in the film thickness direction 140 to initiate a desired crystalline structure in the layers deposited thereabove.

In another approach, a capping layer 126 may be positioned above the free layer 106 to protect the underlying layers during manufacture, such as during high temperature annealing.

A lower electrode 128 and an upper electrode 130 may be positioned near a bottom and a top of the memory element 100, respectively, in one approach. The lower electrode 128 and the upper electrode 130 may be constructed of a non-magnetic, electrically conductive material of a type known in the art, such as Ru, Au, Ag, Cu, etc., and may provide an electrical connection with a circuit 132. The circuit 132 may include a current source, and may further include circuitry for reading an electrical resistance across the memory element 100.

The magnetic free layer 106 has a magnetic anisotropy that causes the magnetization 112 of the free layer 106 to remain stable in one of two directions perpendicular to the horizontal plane of the free layer 106. In a write mode of use for the memory element 100, the orientation of the magnetization 112 of the free layer 106 may be switched between these two directions by applying an electrical current through the memory element 100 via the circuit 132. A current in a first direction causes the magnetization 112 of the free layer 106 of the memory element 100 to flip to a first orientation, and a current in a second direction opposite to the first direction causes the magnetization 112 of the free layer 106 of the memory element 100 to flip to a second, opposite direction.

For example, if the magnetization 112 is initially oriented in an upward direction in FIG. 1, applying a current in a downward direction through the memory element 100 causes electrons to flow in an opposite direction upward through the memory element 100. Electrons travelling through the reference layer 104 become spin polarized as a result of the magnetization 110 of the reference layer 104. These spin-polarized electrons cause a spin torque on the magnetization 112 of the free layer 106, which causes the magnetization 112 to flip directions, from the upward direction to a downward direction.

On the other hand, if the magnetization 112 of the free layer 106 is initially in a downward direction in FIG. 1, applying an electrical current through the memory element 100 in an upward direction in FIG. 1 causes electrons to flow in an opposite direction, downward through the memory element 100. However, because the magnetization 112 of the free layer 106 is opposite to the magnetization 110 of the reference layer 104, the electrons will not be able to pass through the barrier layer 108. As a result, the electrons (which have been spin polarized by the magnetization 112 of the free layer 106) will accumulate at the junction between the free layer 106 and the barrier layer 108. This accumulation of spin polarized electrons causes a spin torque that causes the magnetization 112 of the free layer 106 to flip from the downward direction to an upward direction.

In order to assist the switching of the magnetization 112 of the free layer 106, the memory element 100 may include a spin polarization layer 134 positioned above the free layer 106. The spin polarization layer 134 may be separated from the free layer 106 by an exchange coupling layer 136. The spin polarization layer 134 has a magnetic anisotropy that causes it to have a magnetization 138 with a primary component oriented in the in plane direction (e.g., perpendicular to the magnetization 112 of the free layer and the magnetization 110 of the reference layer 104). The magnetization 138 of the spin polarization layer 134 may be fixed in one approach, or may move in a precessional manner as shown in FIG. 1. The magnetization 138 of the spin polarization layer 134 causes a spin torque on the free layer 106 that assists in moving its magnetization 112 away from its quiescent state perpendicular to the plane of the free layer 106. This allows the magnetization 112 of the free layer 106 to more easily flip with less energy being utilized to flip the magnetization 112 in response to applying a write current to the memory element 100.

The memory element 100 described in FIG. 1 is intended to provide context to the various embodiments described herein. The structures and methods described herein in accordance with various embodiments may comprise a portion of the memory element 100 described in FIG. 1 and/or used in conjunction with the memory element 100, in various approaches.

Figure 2:
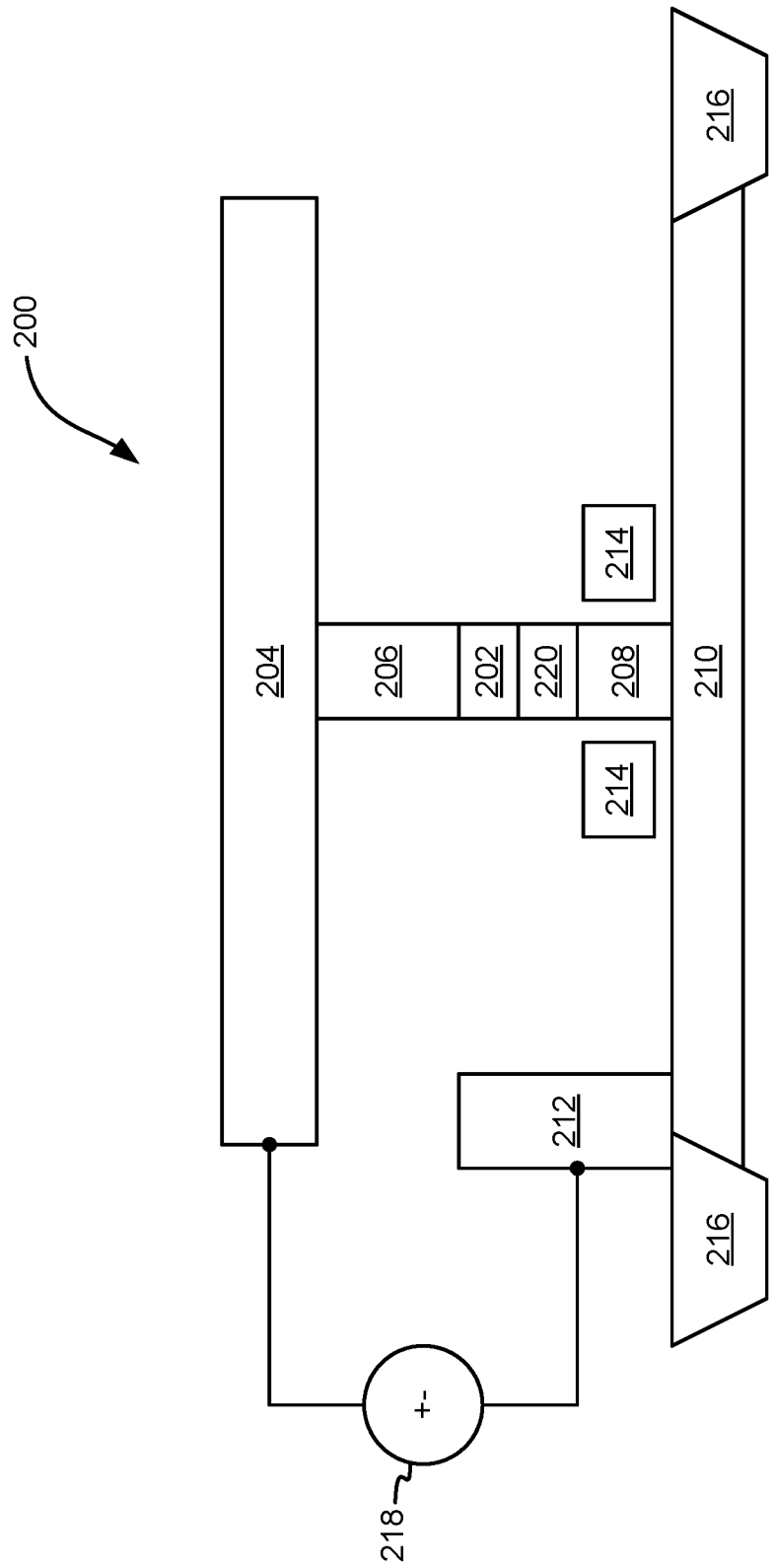
FIG. 2 is a schematic, cross-sectional view of a portion of a magnetic random access memory (MRAM) that includes a magnetoresistive sensor, which may be used in embodiments of the invention.

Now referring to FIG. 2, a portion of a magnetic random access memory (MRAM) structure 200 that includes a magnetoresistive sensor 202 is shown according to one embodiment. The MRAM structure 200 may be operated and utilized as understood by those of skill in the art, with any special use cases being specified in accordance with an embodiment herein. The memory element 100 described in FIG. 1 may be used as the magnetoresistive sensor 202 of FIG. 2 in accordance with embodiments that store data in MRAM. In one embodiment, an MTJ element may be used as the magnetoresistive sensor 202.

The MRAM structure 200 includes a bit line 204 that supplies current across the magnetoresistive sensor 202 from a voltage source 218. The bit line 204 may comprise any suitable material known in the art, such as TaN, W, TiN, Au, Ag, Cu, etc. An extension layer 206 electrically couples the magnetoresistive sensor 202 with the bit line 204. The extension layer 206 may comprise any suitable material known in the art, such as Ru, Ta, etc. A source terminal 220 is coupled between the magnetoresistive sensor 202 and a channel layer 208, which is in electrical contact with a n+ source layer 210. The channel layer 208 may comprise any suitable semiconductor material known in the art, such as Si, Ge, GaAs-compounds, etc. The n+ source layer 210 may comprise any suitable material known in the art, such as TaN, W, TiN, Au. Ag, Cu, etc., and is electrically coupled to the voltage source 218 via a source line 212, which may comprise any suitable material known in the art, such as TaN, W, TiN, Au, Ag, Cu, etc. Positioned across the channel layer 208 is a word line 214 which may comprise any suitable material known in the art, such as TaN, W, TiN, Au, Ag, Cu, etc. On either side of the n+ source layer 210 are shallow trench isolation (STI) layers 216 which provide electrical insulation between an adjacent n+ source layer 210. Moreover, although not specifically shown, electrically insulative material may be positioned around the various layers shown in FIG. 2, as would be understood by one of skill in the art.

Silicon channels that are used to connect conventional MTJs show low field effect mobility compared to III-V semiconductor channels which are constructed of materials such as InGaAs, InAs, etc. The current used during operation of a pMTJ is greater than that used by a typical MTJ during operation. Therefore, a silicon channel semiconductor, which is typically used to deliver voltage to a MTJ is not able to handle the current load of a pMTJ during write operation, e.g., 6-10 mega-ampere per square centimeter ($MA/cm^2$), when a silicon channel is configured to have a minimum size allowed in certain complementary metal-oxide-semiconductor (CMOS) technologies. Therefore, it is desirable to utilize a compound semiconductor channel as an access transistor for a pMTJ memory array.

In addition, in every technology node, minimum-sized transistors only deliver 25-30 µA, which is generally less than the critical current for a pMTJ. The mismatch between pMTJ programming current and transistor ability to drive the pMTJ results in large bit/cell architectures for pMTJ memory arrays, which is undesirable. The structures and methods of manufacturing these structures described herein in various embodiments are capable of delivering more than 60 kA while still using a minimum-sized transistor so that the pMTJ bitcell may be integrated with a minimum-sized transistor.

There have been some attempts to use a vertical transistor as a dynamic random access memory (DRAM) access transistor. However, these access transistors are engineered for smaller off-state current, whereas access transistors for pMTJs should be engineered for high on-state current. One such high on-state current transistor includes a double-gate structure which forms double channels with two different concentric circumferences. This additional channel helps to deliver more currents for pMTJ operation.

Figure 3:
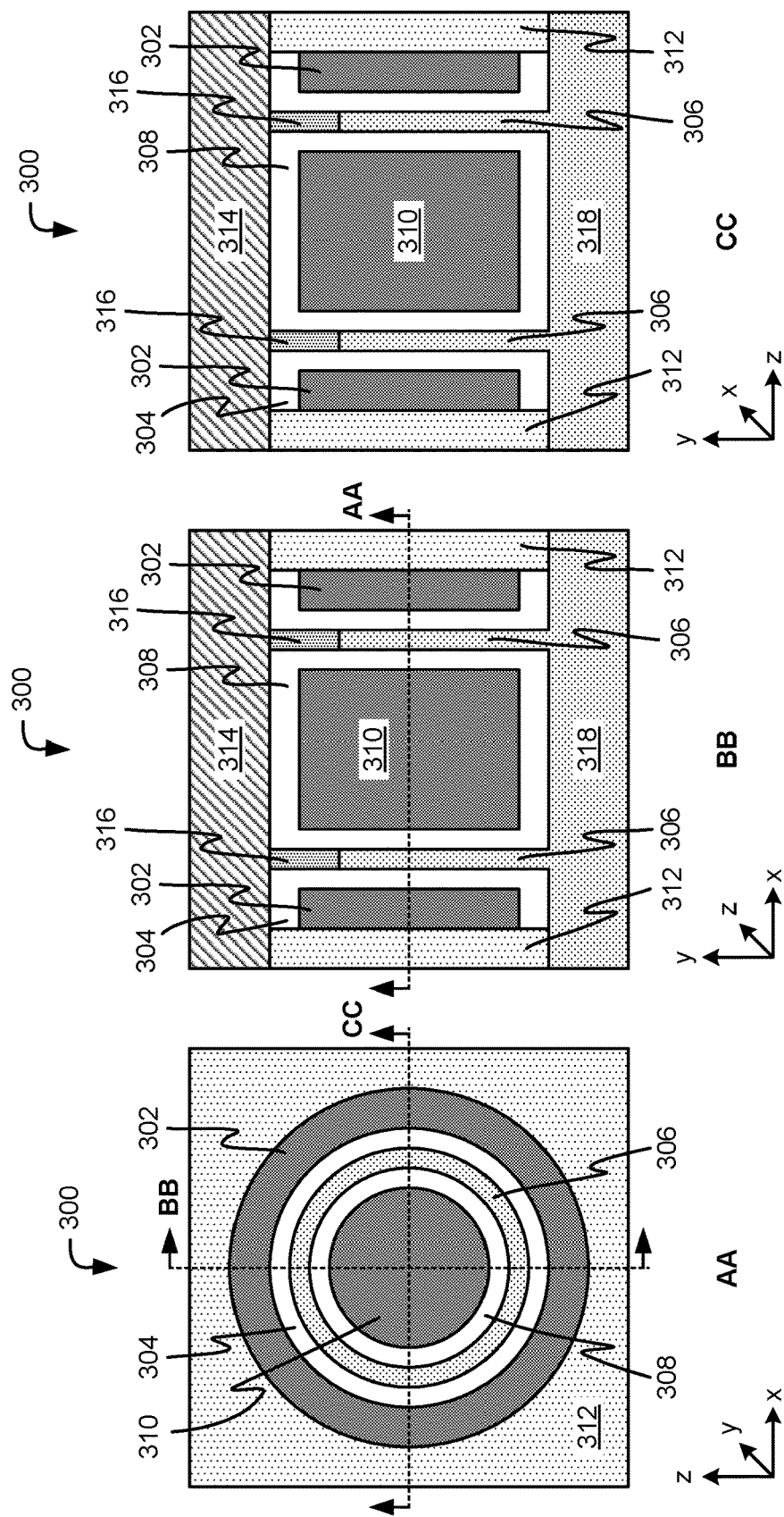
FIG. 3 shows a top-down view (AA), and two cross-sectional views (BB and CC) of a dual channel/gate vertical field-effect transistor (FET) according to one embodiment.

With reference to FIG. 3, a dual channel/gate vertical FET 300 is shown in a top-down view (AA), and two cross-sectional views, one taken at line BB and one taken at line CC, according to one embodiment.

As shown, the vertical FET 300 includes a drain contact 316 positioned above a channel 306 in a film thickness direction (the y-direction). The drain contact 316 and the channel 306 have a circular cross-sectional hole in a center of a circular cross-section thereof along a plane perpendicular to the film thickness direction, as shown in the top-down view AA. Gate dielectric layers 304, 308 are positioned on sides of the drain contact 316 and on sides of the channel 306. The gate dielectric layers 304, 308 have concentric circular cross-sections along the plane perpendicular to the film thickness direction as shown in the top-down view AA, the circular cross-section of the drain contact 316 and the circular cross-section of the channel 306 have an inner circular cross-sectional portion of the gate dielectric layer 308 in direct contact on an inner side thereof, along with an outer circular cross-sectional portion of the gate dielectric layer 304 in direct contact on an outer side thereof, as clearly shown in the top-down view AA.

In addition, the vertical FET 300 further includes two gate layers (an inner gate layer 310 and an outer gate layer 302) positioned on sides of the gate dielectric layers 304, 308. The gate layers 302, 310 have a lower surface at a level above an upper surface of a source line 318 and a thickness coincident with or above a lower surface of the drain contact 316 in the film thickness direction. However, the upper surface of the gate layers 302, 310 is not at a level consistent with an electrode 314 to ensure electrical insulation of the gate layers 302, 310. The inner gate layer 310 fills a hole through a center of a center concentric circular cross-section of the gate dielectric layers 308 along the plane perpendicular to the film thickness direction, and the outer gate layer 302 surrounds an outside concentric circular cross-section of the gate dielectric layers 304 along the plane perpendicular to the film thickness direction.

As shown, the gate layers 302, 310 are electrically insulated from the channel 306, the drain contact 316, and the source line 318 by one or more insulative layers, including the gate dielectric layers 304, 308, and by being formed to have a thickness that is less than a thickness of the channel 306 and drain contact 316 together.

The source line 318 is positioned below the channel 306 in the film thickness direction, and is electrically coupled to the channel 306. Moreover, the source line 318 is configured to electrically couple to a plurality of additional channels in a direction along the plane perpendicular to the film thickness direction (which is not shown, but is reflective of the source line 318 having a rectangular cross-section in either of views BB or CC.

Above the upper surface of the drain contact 316 is the electrode 314 configured to couple to other structures formed and/or bonded thereabove. An insulative layer 312 is positioned on sides of the gate layers 302, 310, sides of the gate dielectric layers 304, 308, and sides of the electrode 314 (not shown) along the plane perpendicular to the film thickness direction.

According to various approaches, the drain contact 316 may include any suitable material known in the art, such as W, TaN, TiNi, TiN, etc., the channel 306 may include any suitable material known in the art such as Si, the gate dielectric layers 304, 308 and the insulative layer 312 may include any suitable material known in the art, such as $SiO_2$, SiON, $ZrO_2$, $HfO_2$, $Al_2O_3$, etc., the electrode 314 may include any suitable material known in the art, such as W, TaN, TiNi, TiN, etc., the source line 318 may include any suitable material known in the art, such as doped polysilicon, W, TaN, TiNi, TiN, etc., and the gate layers 302, 310 may include any suitable material known in the art, such as doped polysilicon, W, TaN, TiNi, TiN, etc.

In one embodiment, this vertical FET may have a pMTJ formed and/or bonded thereabove in the film thickness direction. The pMTJ may include, in one approach, a seed layer positioned above the electrode in the film thickness direction, an underlayer positioned above the seed layer in the film thickness direction, a synthetic antiferromagnetic (SAF) seed layer positioned above the underlayer in the film thickness direction, a first SAF layer positioned above the SAF seed layer in the film thickness direction, a spacer layer positioned above the first SAF layer in the film thickness direction, an antiferromagnetic (AFM) coupling layer positioned above the spacer layer in the film thickness direction, a second SAF layer positioned above the AFM coupling layer in the film thickness direction, a ferromagnetic (FM) coupling layer positioned above the second SAF layer in the film thickness direction, a reference layer positioned above the FM coupling layer in the film thickness direction, a barrier layer positioned above the reference layer in the film thickness direction, a free layer positioned above the barrier layer in the film thickness direction, and at least one cap layer positioned above the free layer in the film thickness direction.

Figure 4A:
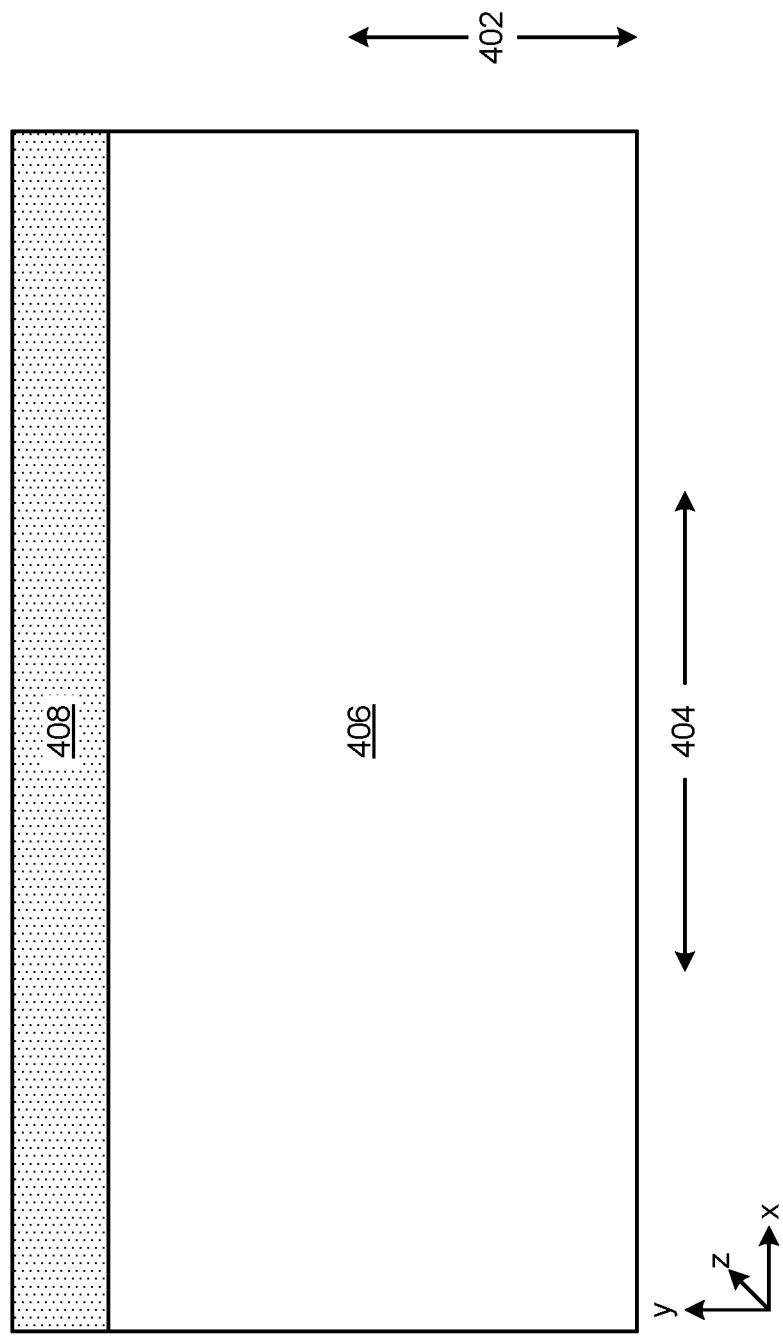
FIGS. 4A-4R show various structures created during manufacture of a dual channel/gate vertical FET according to one embodiment.
Figure 4C:
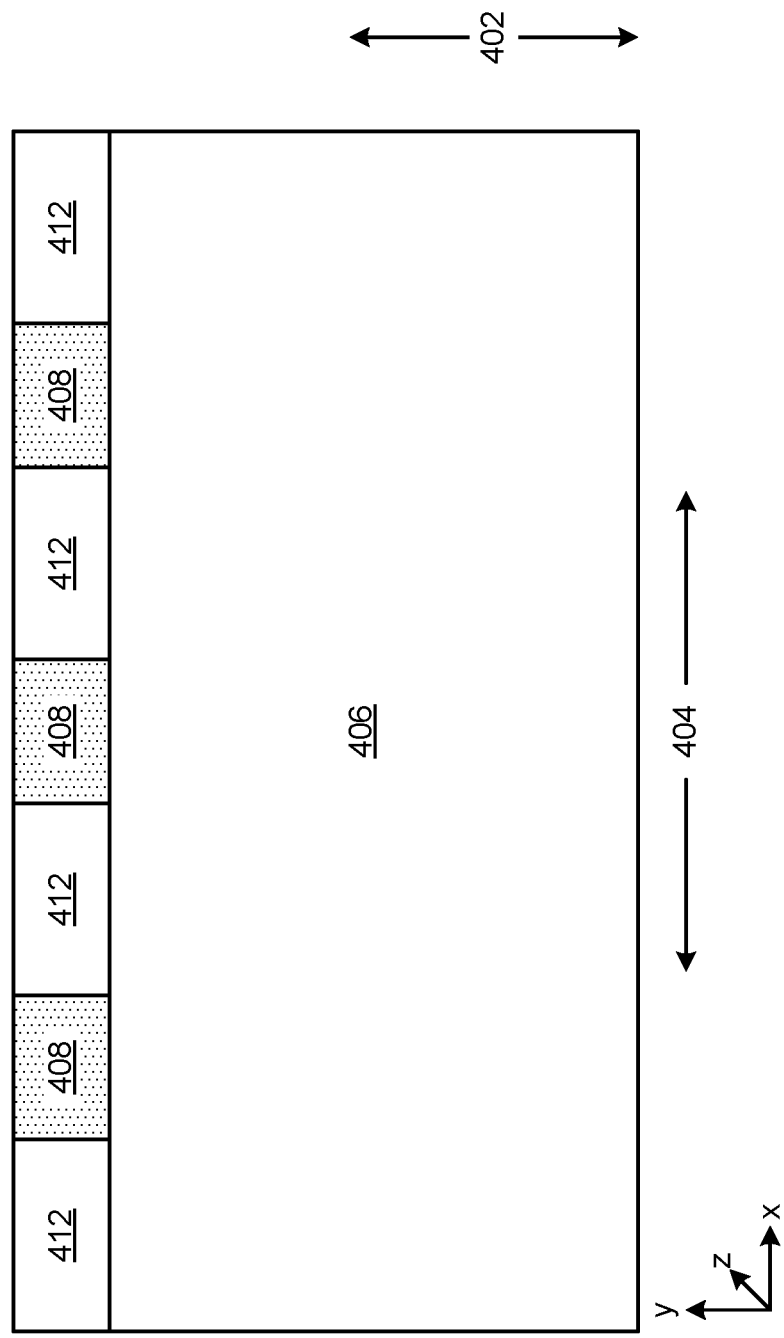
Figure 4E:
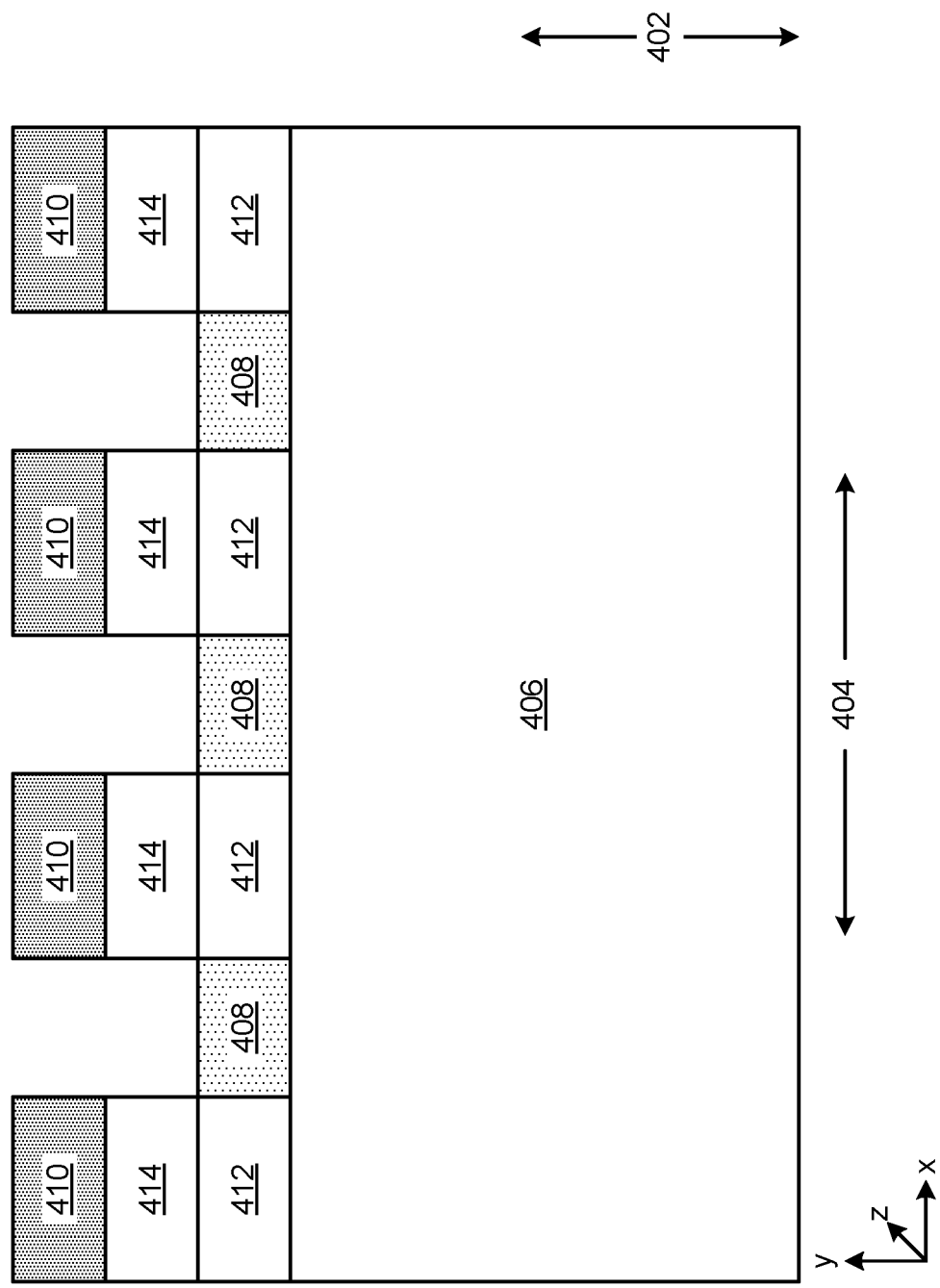
Figure 4F:
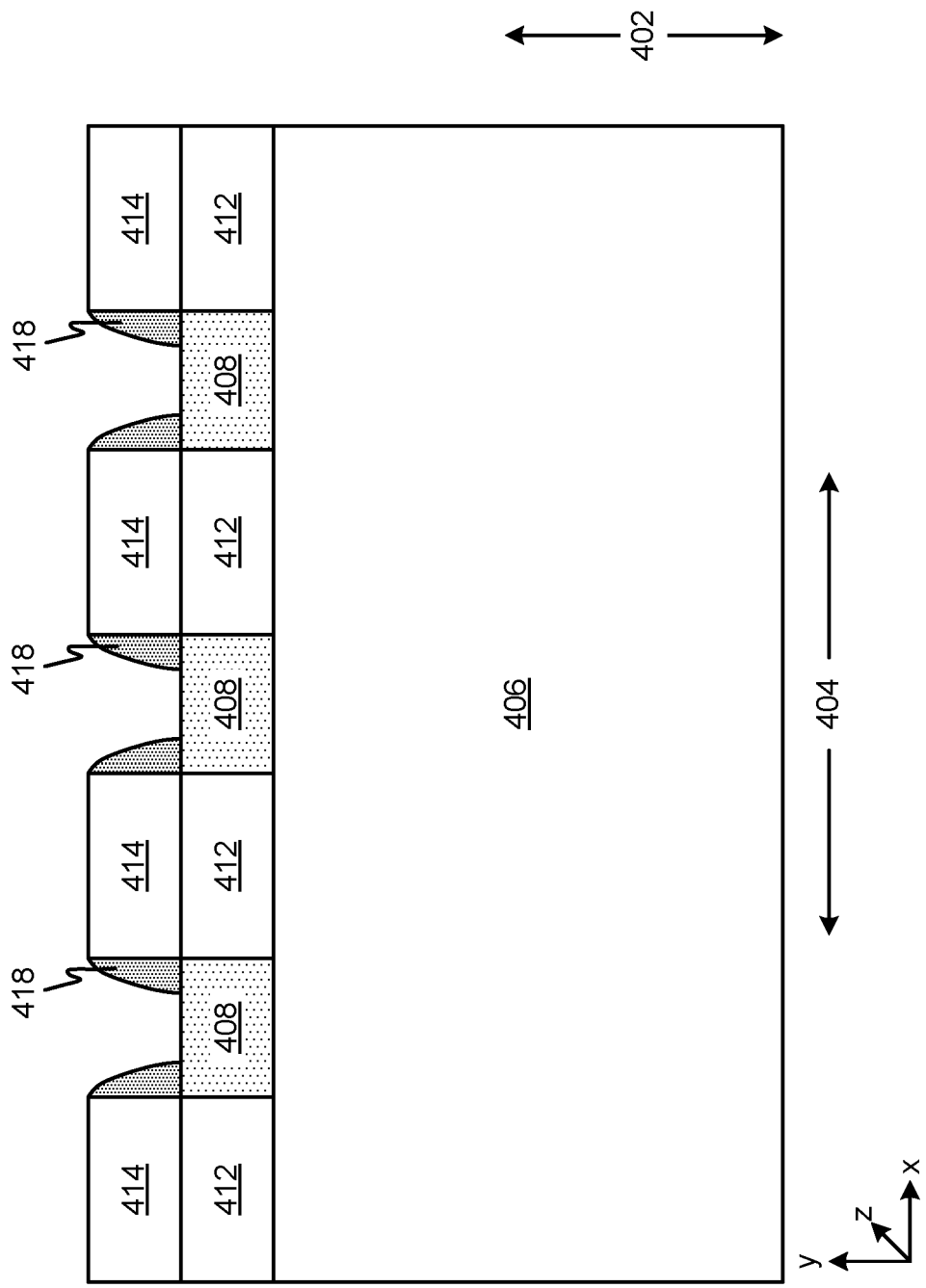
Figure 4G:
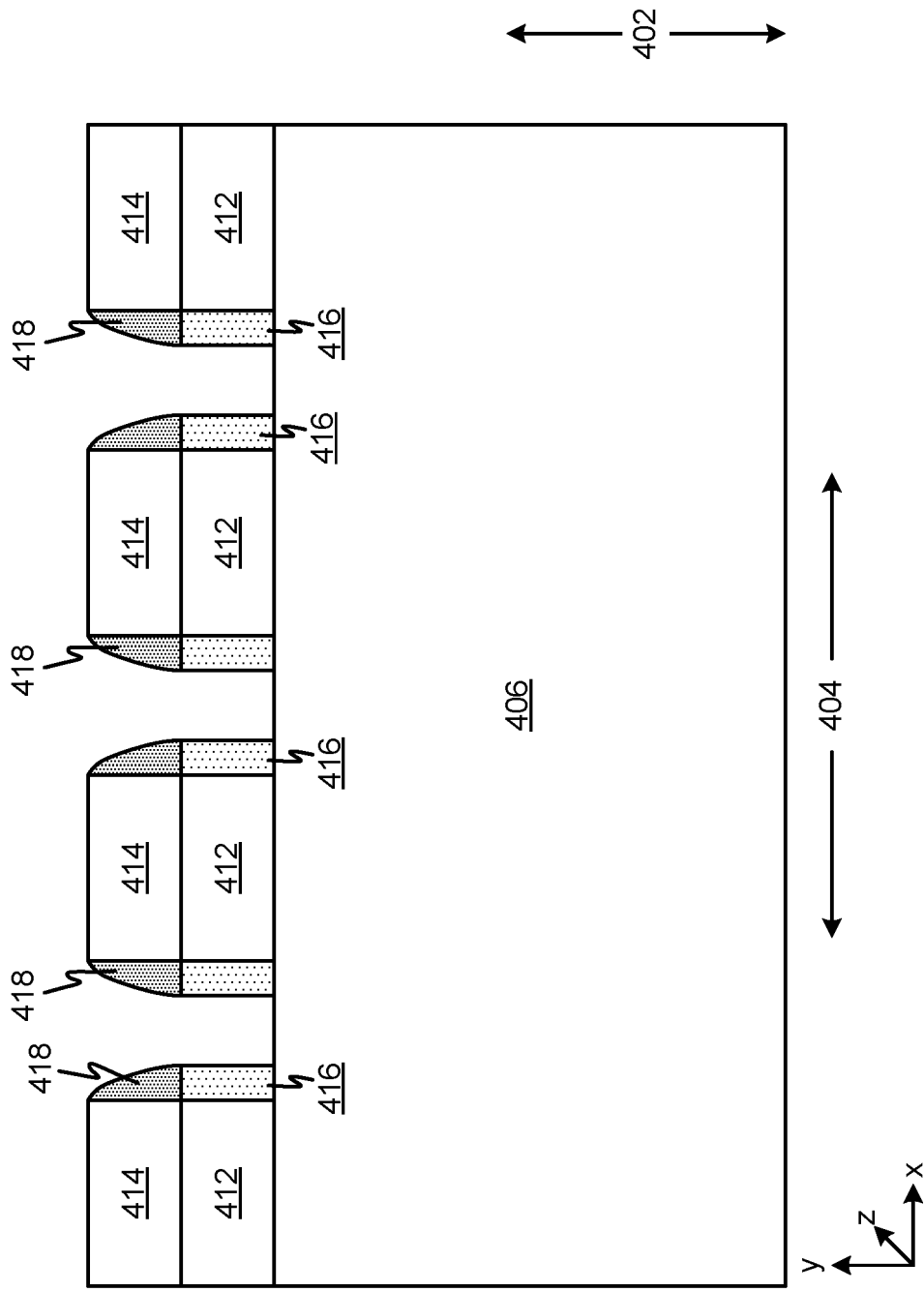
Figure 4H:
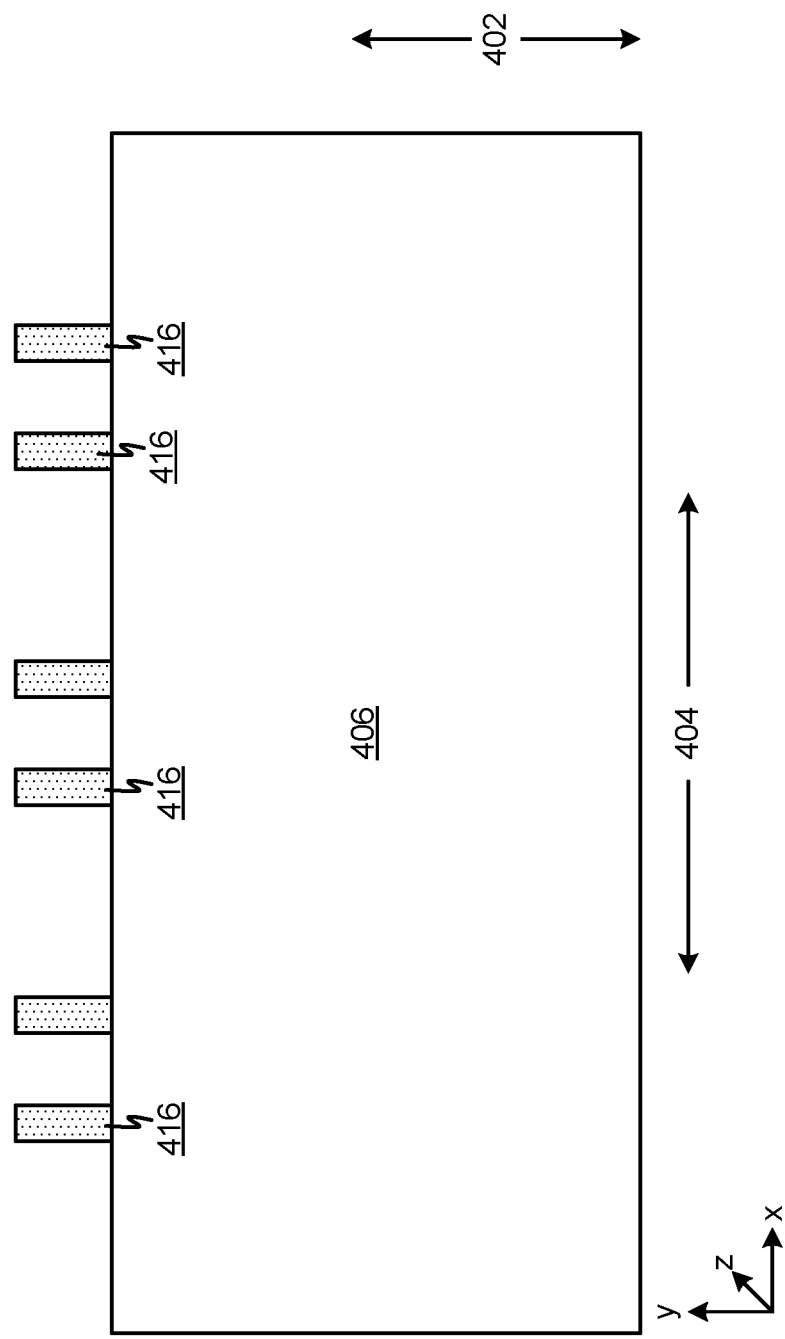
Figure 4I:
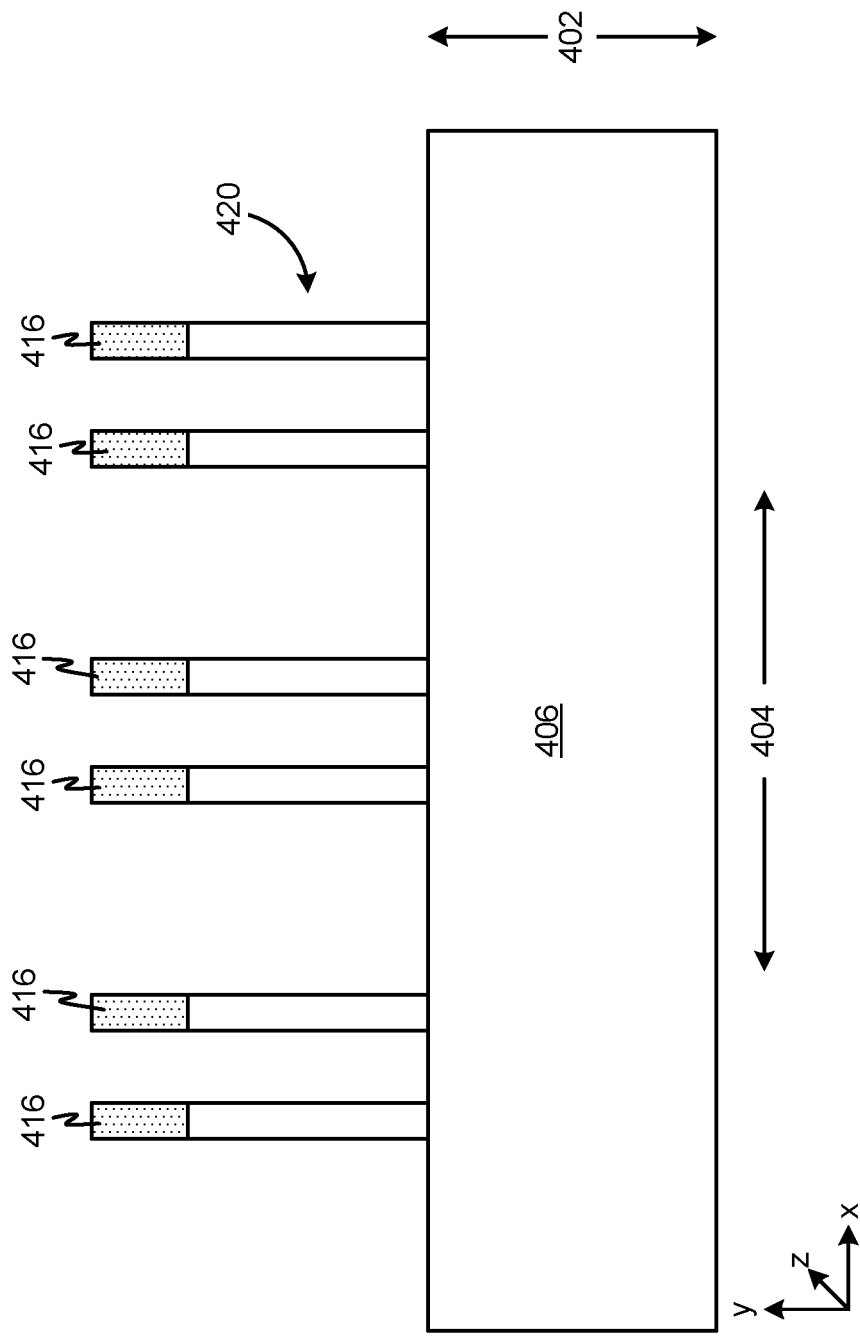
Figure 4J:
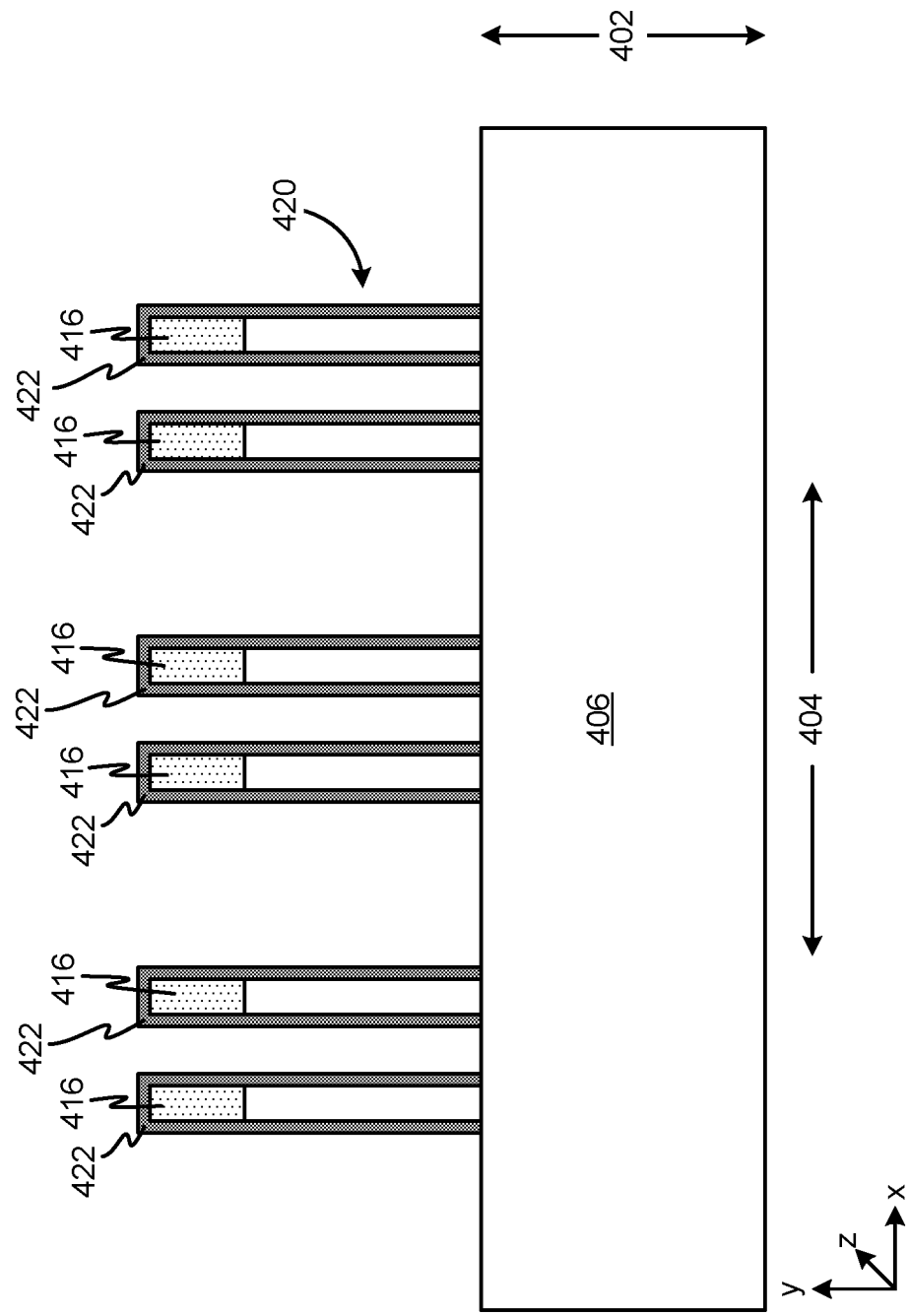
Figure 4L:
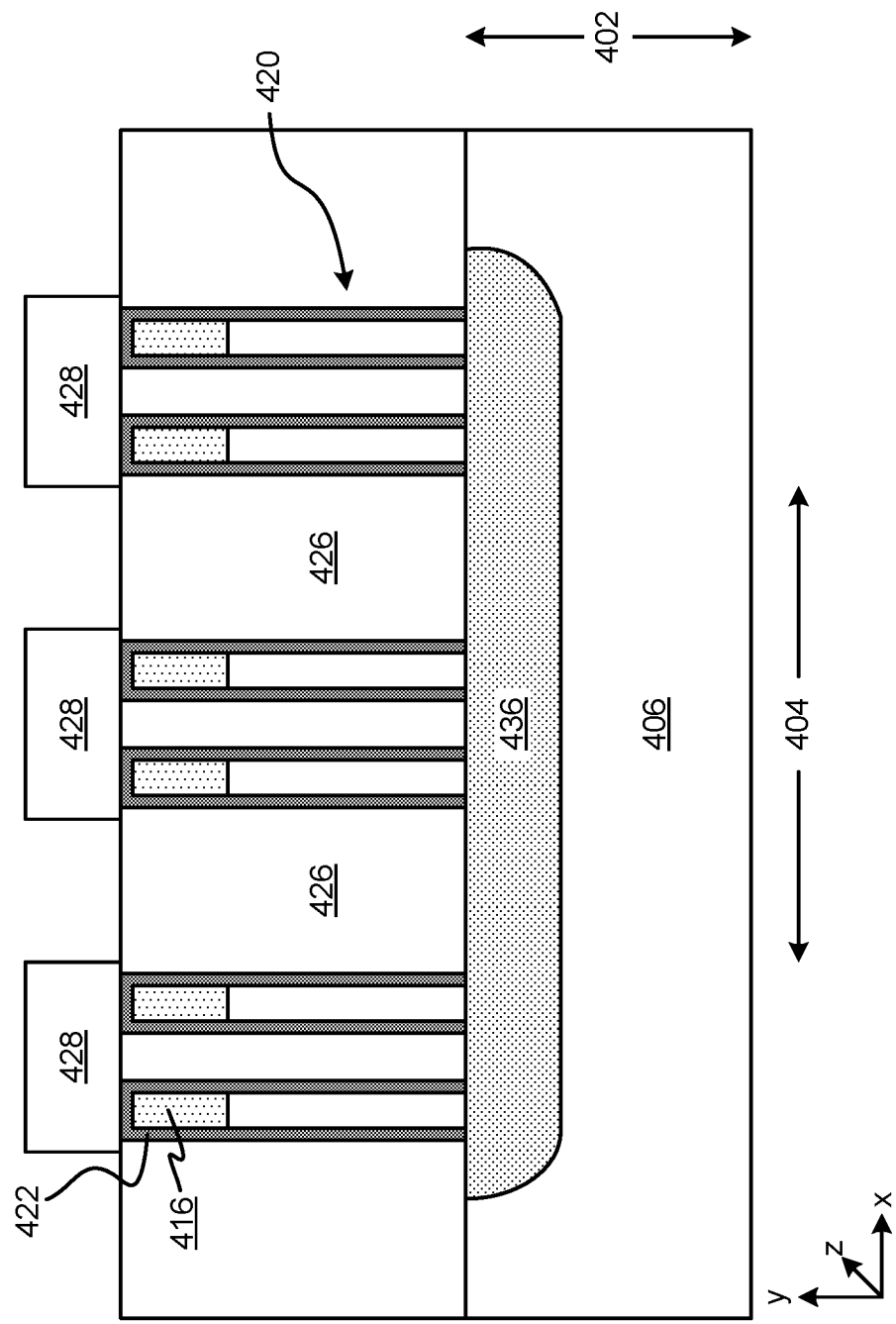
Figure 4M:
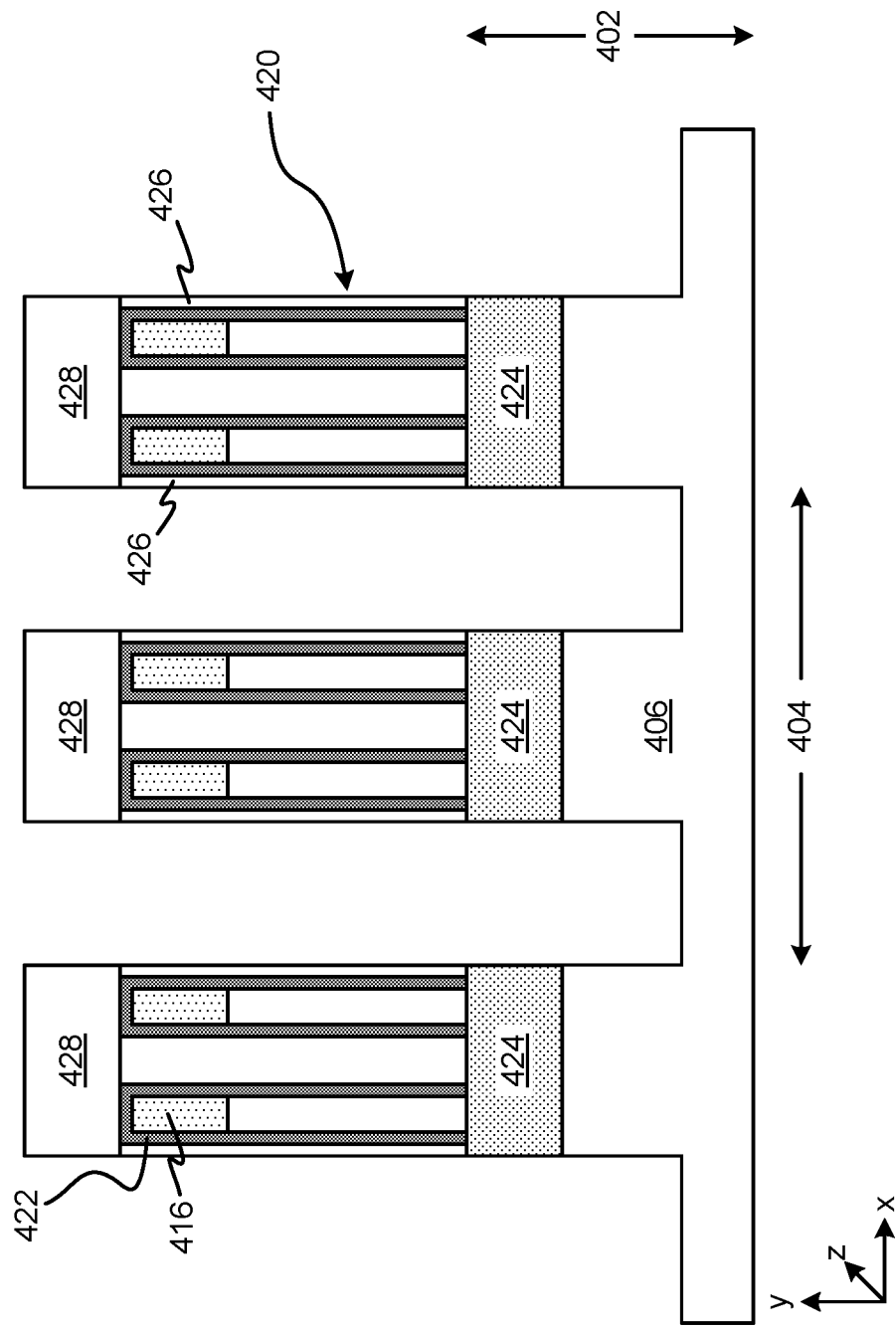
Figure 4N:
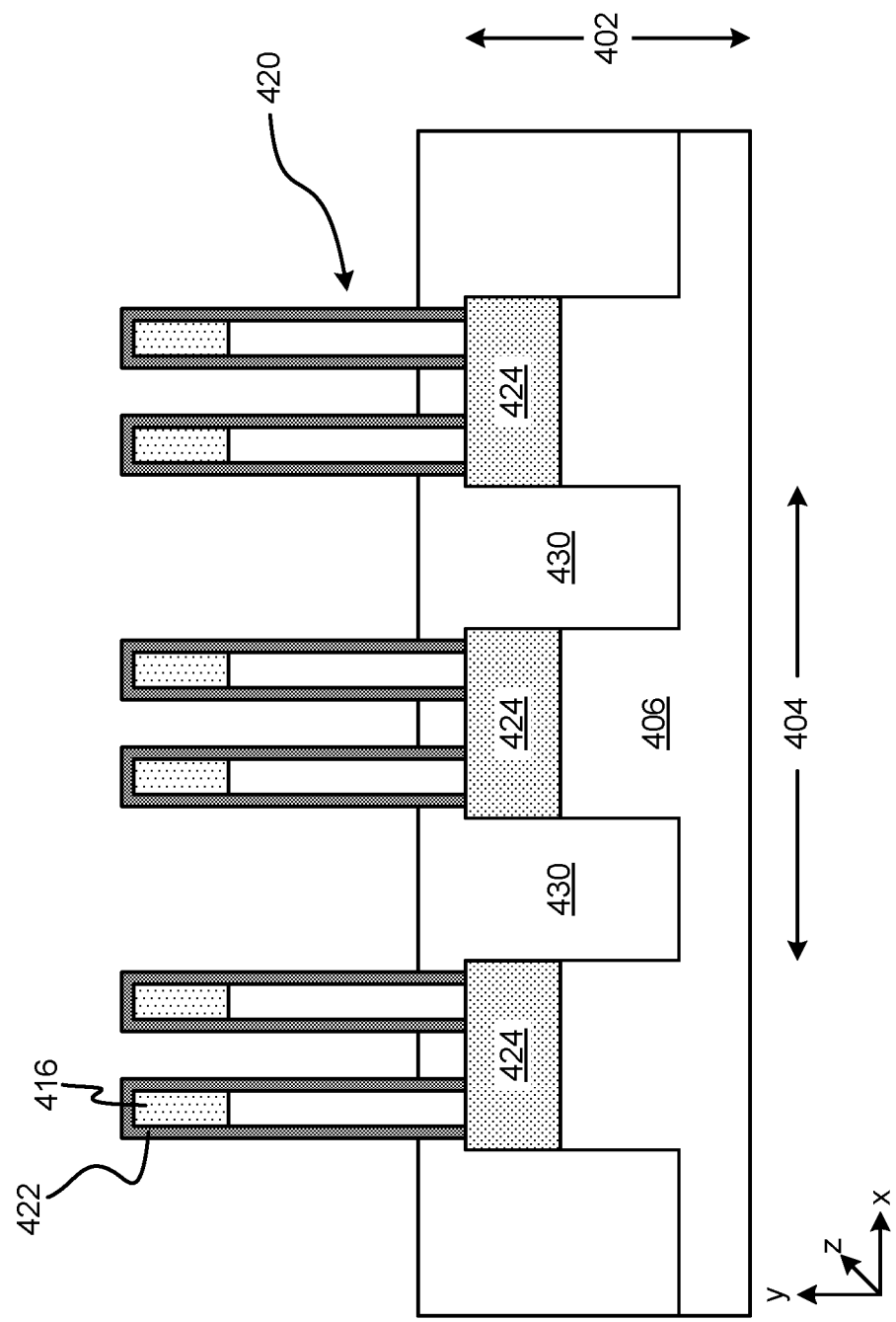
Figure 4O:
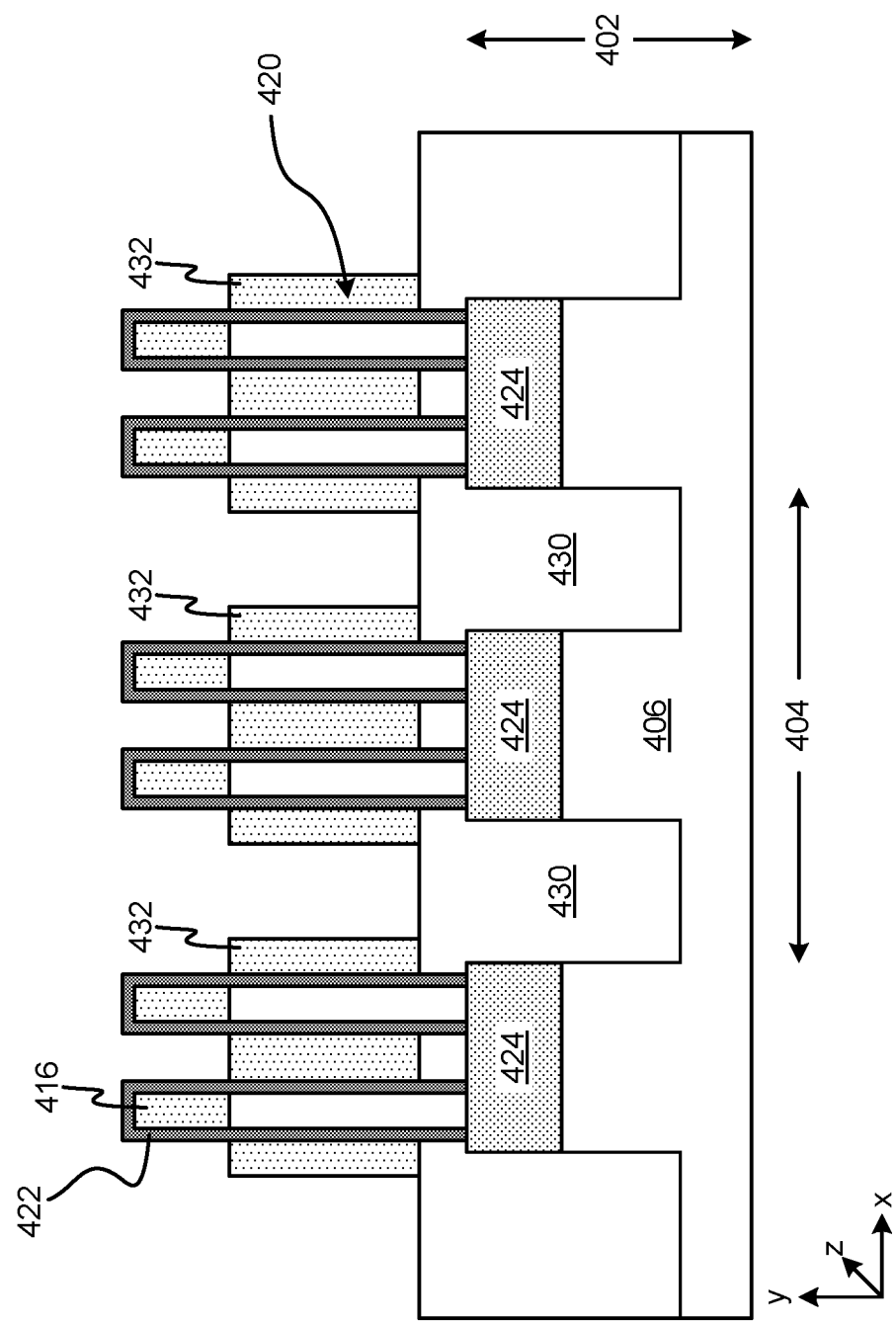
Figure 4P:
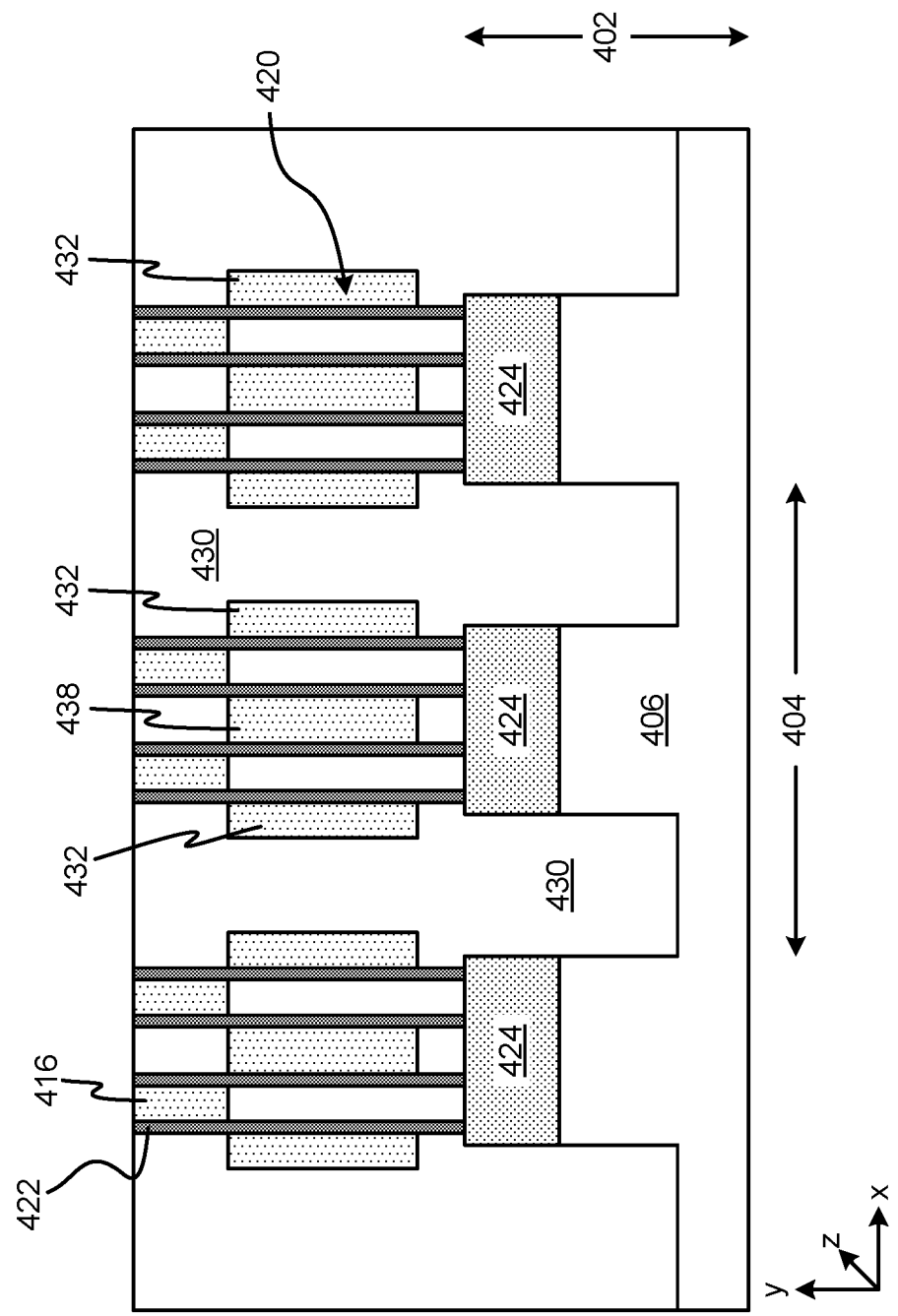
Figure 4Q:
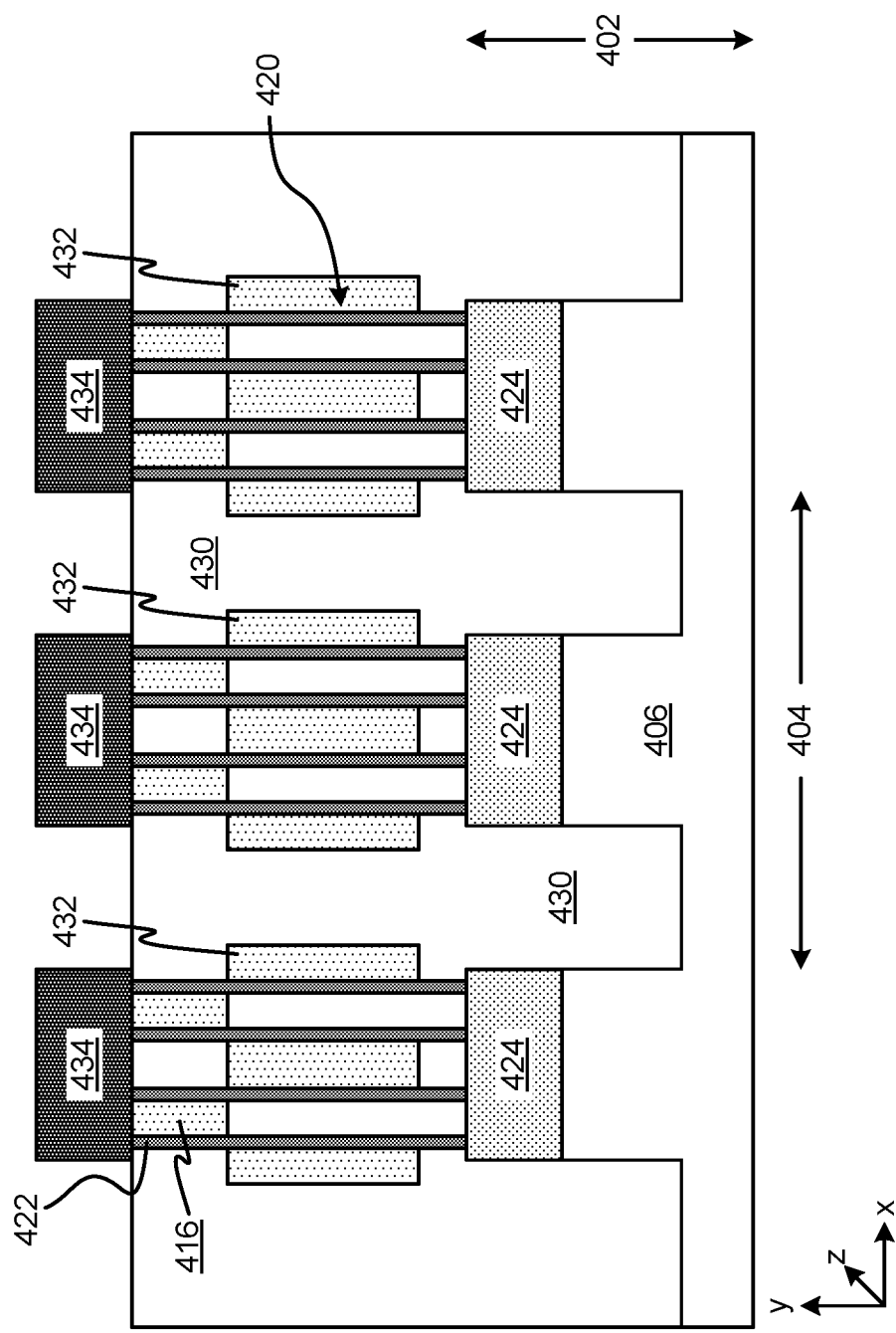
Figure 4R:
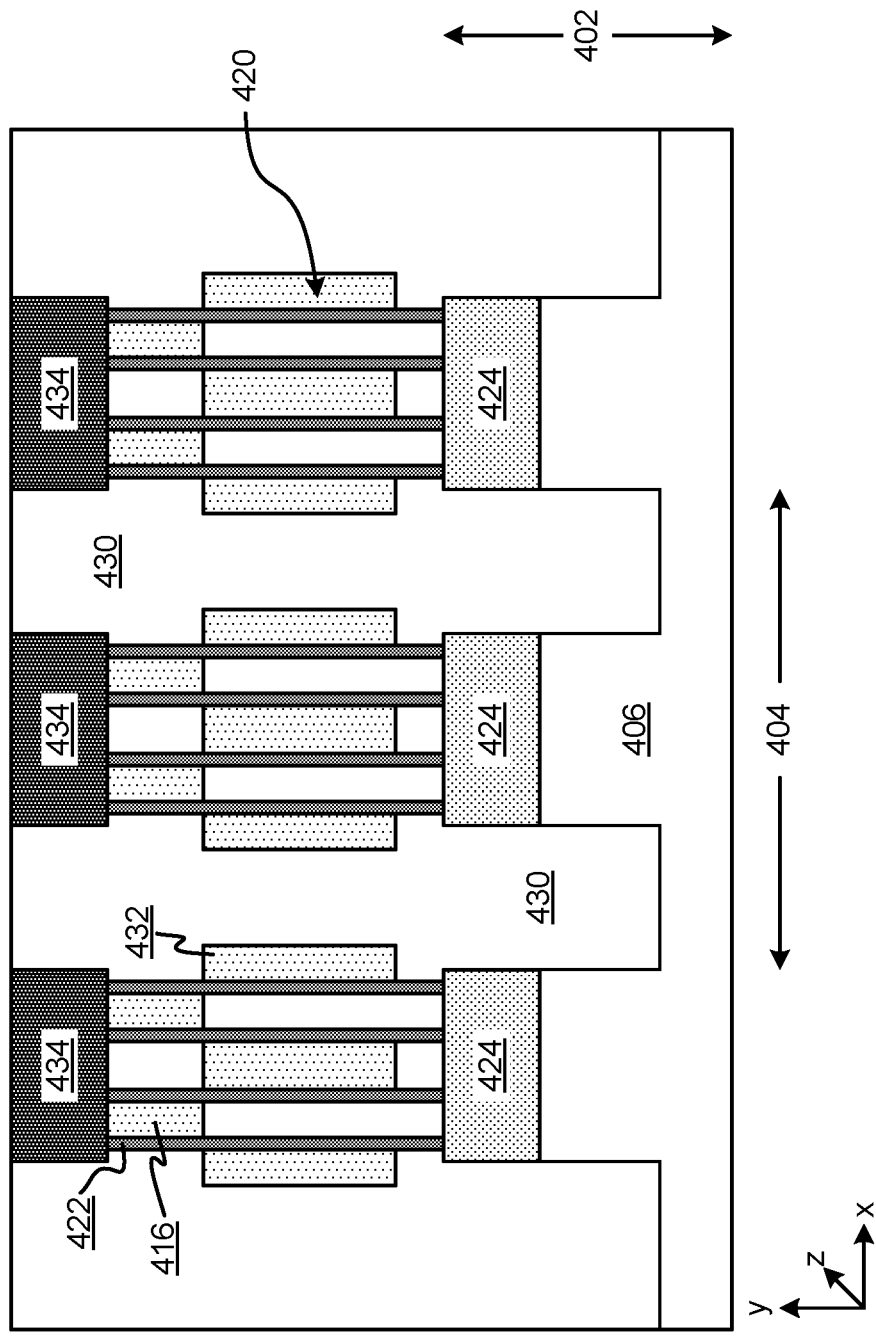

Now referring to FIGS. 4A-4R, formation of a dual channel/gate vertical FET is shown according to one embodiment. The structure may be used in conjunction with one or more pMTJs because it is capable of handling the current load required by pMTJs, in various approaches. Moreover, the structure may be formed in accordance with the present invention in any of the environments depicted herein, among others not specifically described, in various approaches. Of course, more steps, layers, and/or structures may be utilized in the formation of any of the structures and/or layers thereof than those specifically described in FIGS. 4A-4R, as would be understood by one of skill in the art upon reading the present descriptions.

In FIGS. 4A-4R, two directions are shown, with the x-direction being an element width direction 404 and the y-direction being a film thickness direction 402. The z-direction is an element depth direction and is not shown, but may be visualized as being into the page.

Each of the intermediate structures shown in FIGS. 4A-4R may be formed by any suitable component of the operating environment. For example, in various embodiments, the structure(s) may be partially or entirely formed by a machine, controller, processing circuit, or some other device or combination of devices suitable for manufacturing and/or processing a thin film structure. A processing circuit may include one or more processors, chips, and/or modules implemented in hardware and/or software, and preferably having at least one hardware component, and may be utilized in any device to form one or more structures or layer thereof. Illustrative processing circuits include, but are not limited to, a central processing unit (CPU), an application specific integrated circuit (ASIC), a field programmable gate array (FPGA), etc., combinations thereof, or any other suitable computing device known in the art.

In the descriptions of FIGS. 4A-4R, each layer may be formed using any known deposition process, such as sputtering, plating, chemical vapor deposition (CVD), plasma chemical vapor deposition (pCVD), physical vapor deposition (PVD), molecular beam epitaxy (MBE), atomic layer deposition (ALD), etc. Moreover, any descriptions of removal of layers and/or material may be performed using any material removal process of a type known in the art, such as planarization, chemical mechanical polishing (CMP), recess etching, reactive ion etching (RIE), ion milling, plasma etching, photolithography, etc.

In FIGS. 4A-4R, three vertical FETs are shown being formed contemporaneously. However, the embodiments described herein are not so limited, as any number of vertical FETs may be formed concurrently as desired, such as 1, 2, 5, 10, 100, etc. Therefore, the descriptions of FIGS. 4A-4R refer to the formation of just one of the structures, but may be performed concurrently to form any desired number of vertical FETs at a time.

As shown in FIG. 4A, a drain material 408 is formed above a substrate 406 in the film thickness direction 402. A planarization process may be performed after formation of the drain material 408 in one approach. The substrate 406 may comprise any suitable material known in the art, including crystalline Si in one approach. The drain material 408 may comprise any suitable material known in the art, such as W, TaN, TiNi, TiN, etc.

With reference to FIG. 4B, a first masking layer 410 is formed above the drain material in the film thickness direction 402, and then patterned to form holes having a circular cross-section along a plane (x-z plane) perpendicular to the film thickness direction 402 (y-direction). In this way, the first masking layer 410 is patterned to expose a portion of the drain material 408 having a circular cross-section along the plane (x-z plane) perpendicular to the film thickness direction 402 (y-direction). This plane lies along the element width direction 404 (x-direction) and along the element depth direction (z-direction).

The first masking layer 410 may include any suitable material known in the art, such as $SiO_2$, SiON, $ZrO_2$, $HfO_2$, $Al_2O_3$, etc.

Next, all portions of the drain material 408 except for the exposed portion of the drain material 408 (and portions positioned directly therebelow in the film thickness direction 402) are removed using the first masking layer 410 as a guide, as shown in FIG. 4C. This is referred to as a negative tone mask or photoresist process, because the material which is removed is positioned below and in contact with the first masking layer 410, and is lifted off when the first masking layer 410 is removed. In response to removing the first masking layer 410 during or after removal of the portions of the drain material 408, a first insulative layer 412 is formed above portions of the substrate 406 not covered by the drain material 408 to a thickness consistent with an upper surface of the drain material 408 in the film thickness direction 402. A planarization process may be performed after formation of the first insulative layer 412 in one approach.

With reference to FIG. 4D, a second insulative layer 414 is formed (full film) above the first insulative layer 412 and the drain material 408 in the film thickness direction 402 to a desired thickness. This thickness may be tightly controlled, and may be within a range including about 30 nm to about 50 nm, such as about 40 nm. A planarization process may be performed after formation of the second insulative layer 414 in one approach. Above the second insulative layer 414, the first masking layer 410 is replaced (or a new masking layer is produced that matches the first masking layer 410) such that it is aligned with previous placement of the first masking layer 410 as shown in FIG. 4B above the substrate 406. As shown in FIG. 4D, this exposes a portion of the second insulative layer 414 having the circular cross-section along the plane perpendicular to the film thickness direction 402.

The second insulative layer 414 may include any suitable material known in the art, such as $SiO_2$, SiON, $ZrO_2$, $HfO_2$, $Al_2O_3$, etc.

Now referring to FIG. 4E, the exposed portion of the second insulative layer 414 is removed to expose the upper surface of the drain material 408. This is referred to as a positive tone mask or photoresist process, because the material which is removed is not covered by the first masking layer 410, and is removed via etching or some other suitable removal process using the first masking layer 410 to cover areas that are not to be removed.

With reference to FIG. 4F, the first masking layer 410 is removed during or after removal of the exposed portion of the second insulative layer 414, and then the second insulative layer 414 is grown or added to along the plane perpendicular to the film thickness direction 402 (shown as newly added insulative material 418) to shrink a diameter of a hole through the second insulative layer 414 having the circular cross-section along the plane perpendicular to the film thickness direction 402.

Now referring to FIG. 4G, exposed portions of the drain material 408 are removed through the hole of the second insulative layer 414 caused by formation of the new insulative material 418 to form a drain contact 416 having a circular cross-sectional hole in a center thereof along the plane perpendicular to the film thickness direction 402.

With reference to FIG. 4H, the first insulative layer 412 and the second insulative layer 414 (including the new insulative material 418) are removed, which results in the drain contact 416 being positioned above the substrate 406.

Now referring to FIG. 4I, portions of the substrate 406 positioned directly below the drain contact 416 are removed to a desired level in the film thickness direction 402 to form a channel 420 having the circular cross-section with a hole in a center thereof along the plane perpendicular to the film thickness direction 402. The height (thickness) of this channel 420 in the film thickness direction 402 is controlled based on the depth of the material removal.

With reference to FIG. 4J, gate dielectric layers 422 are formed above the drain contact 416 and on sides of the drain contact 416 and the channel 420. The gate dielectric layers 422 have concentric circular cross-sections along the plane perpendicular to the film thickness direction 402. Moreover, the circular cross-section of the drain contact 416 has one circular cross-sectional portion of the gate dielectric layers 422 in direct contact on either side thereof.

The gate dielectric layers 422 may include any suitable material known in the art, such as $SiO_2$, SiON, $ZrO_2$, $HfO_2$, $Al_2O_3$, etc.

Now referring to FIG. 4K, a source layer 436 is formed below the channel 420 in the film thickness direction 402, the source layer 436 being electrically coupled to the channel 420. In one embodiment, the source layer 436 may include any suitable electrically conductive material, such as doped polysilicon, W, TaN, TiNi, TiN, etc.

In another approach, the source layer 436 may be formed by doping the substrate 406 with ions to a desired depth to form an n+ doped polysilicon material, which will act as the source line.

With reference to FIG. 4L, another insulative layer 426 is formed up to a level of the upper surface of the gate dielectric layers 422. The insulative layer 426 may include any suitable material known in the art, such as $SiO_2$, SiON, $ZrO_2$, $HfO_2$, $Al_2O_3$, etc. A planarization process may be performed after formation of the insulative layer 426 in one approach. Thereafter, a second masking layer 428 is formed above a portion of the gate dielectric layers 422 positioned above the drain contact 416 and above the hole in the center of the drain contact 416 in the film thickness direction 402 (and when formed full film, subsequently patterned to leave holes above the insulative layer 426). The second masking layer 428 may include any suitable material known in the art, such as SiO$_2$, SiON, ZrO$_2$, HfO$_2$, Al$_2$O$_3$, etc.

The second masking layer 428 has a rectangular cross-section along the plane perpendicular to the film thickness direction 402 that is positioned above a plurality of drain contacts (not shown, but may be envisioned as being positioned behind the structures shown in the z-direction into the page.

Thereafter, portions of the source layer 436 and substrate 406 not covered by the second masking layer 428 are removed in the film thickness direction 402 to form a source line 424, as shown in FIG. 4M. The source line 424 is electrically coupled to a plurality of channels 420 along the plane perpendicular to the film thickness direction 402.

Next, the second masking layer 428 is removed, and with reference to FIG. 4N, a third insulative layer 430 is formed to a thickness in the film thickness direction 402 that corresponds to a desired height of a lower surface of subsequently formed gate layers. A planarization process may be performed after formation of the third insulative layer 430 in one approach. The third insulative layer 430 may include any suitable material known in the art, such as SiO$_2$, SiON, ZrO$_2$, HfO$_2$, Al$_2$O$_3$, etc.

Now referring to FIG. 4O, the gate layers 432, 438 are formed above the third insulative layer 430 on sides of the gate dielectric layers 422 to a thickness coincident with a lower surface of the drain contact 416 (or just above or just below this surface) in the film thickness direction 402. The gate layers 432, 438 each include any suitable material known in the art, such as doped polysilicon, W, TaN, TiNi, TiN, etc.

An inner gate layer 438 is formed within an inner core of the channel 420 and fills a hole through a center of a center concentric circular cross-section of the gate dielectric layers 422 along the plane perpendicular to the film thickness direction 402. Also, an outer gate layer 432 surrounds an outside concentric circular cross-section of the gate dielectric layers 422 along the plane perpendicular to the film thickness direction 402.

The gate layers 432, 438 are electrically insulated from the channel 420 by the gate dielectric layers 422, and the drain contact 416 and the source line 424 due to location and inclusion of insulative material 430.

Now referring to FIG. 4P, an upper portion of the gate dielectric layers 422 above the drain contact 416 is removed to expose an upper surface of the drain contact 416. A planarization process may be used to perform this material removal.

With reference to FIG. 4Q, an electrode 434 is formed above the upper surface of the drain contact 416 (and electrically coupled thereto). The electrode 434 is positioned above the channel 420 and does not extend beyond sides of the outer gate layer 432 in the x-direction. However, the electrode 434 may contact more than one circular drain contact 416 when used in a shared drain arrangement. The electrode 434 may include any suitable material known in the art, including W, TaN, TiNi, TiN, etc.

Now referring to FIG. 4R, a fourth insulative layer (shown as growth of the third insulative layer 430) is formed above the third insulative layer 430, the outer gate layers 432, and a small area of the substrate 406 in the film thickness direction 402, and along sides of the electrode 434 along the plane perpendicular to the film thickness direction 402. This fourth insulative layer is formed to a height of the upper surface of the electrode 434. A planarization process may be performed after formation of the fourth insulative layer in one approach.

Thereafter, in a further embodiment, a transistor, junction, or some electrical component may be formed above the electrode 434 (or a plurality of components above a plurality of the electrodes 434).

In one such embodiment, a pMTJ may be formed above one or more of the electrodes 434 in the film thickness direction 402. In this embodiment, at least one of the channels 420 is electrically coupled to the pMTJ. In one further embodiment, the pMTJ may comprise a seed layer, an underlayer positioned above the seed layer, a SAF seed layer positioned above the underlayer, a first SAF layer positioned above the SAF seed layer, a spacer layer positioned above the first SAF layer, an AFM coupling layer positioned above the spacer layer, a second SAF layer positioned above the AFM coupling layer, a FM coupling layer positioned above the second SAF layer, a reference layer that comprises a first reference layer positioned below a second reference layer, a barrier layer positioned above the reference layer, a free layer which includes a lower free layer positioned above the barrier layer, a middle free layer positioned above the lower free layer, and an upper free layer positioned above the middle free layer. The pMTJ may also comprise a first cap layer positioned above the upper free layer, a second cap layer positioned above the first cap layer, a third cap layer positioned above the second cap layer, and a fourth cap layer positioned above the third cap layer.

Figure 5:
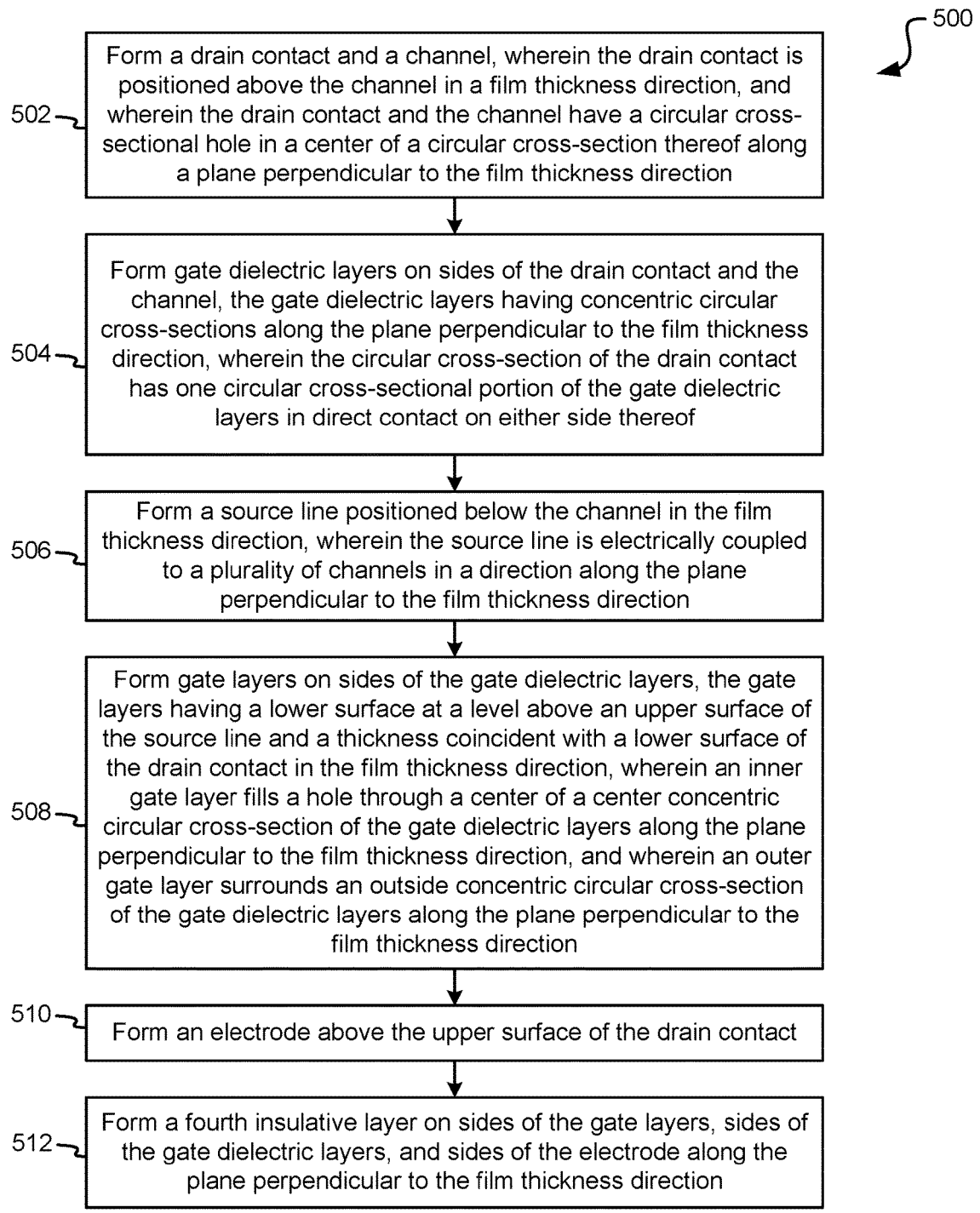
FIG. 5 shows a flow diagram of a method according to one embodiment.

Now referring to FIG. 5, a method 500 of forming a vertical FET is shown according to one embodiment. The method 500 may be performed in accordance with the present invention in any of the environments depicted in FIGS. 1-4R, among others not specifically described, in various approaches. Of course, more or less operations than those specifically described in FIG. 5 may be included in method 500, as would be understood by one of skill in the art upon reading the present descriptions.

Each of the operations of method 500 may be performed by any suitable component of the operating environment. For example, in various embodiments, method 500 may be partially or entirely performed by a machine, controller, processing circuit, or some other device or combination of devices suitable for manufacturing and/or processing a thin film structure. A processing circuit may include one or more processors, chips, and/or modules implemented in hardware and/or software, and preferably having at least one hardware component, and may be utilized in any device to perform one or more operations of method 500. Illustrative processing circuits include, but are not limited to, a CPU, an ASIC, a FPGA, etc., combinations thereof, or any other suitable computing device known in the art.

In the descriptions of method 500, each layer may be formed using any known deposition process, such as sputtering, plating, CVD, pCVD, PVD, MBE, ALD, etc. Moreover, any descriptions of removal of layers and/or material may be performed using any material removal process of a type known in the art, such as planarization, CMP, recess etching, RIE, ion milling, plasma etching, photolithography, etc.

Method 500 may begin with operation 502, where a drain contact and a channel are formed. The drain contact is positioned above the channel in a film thickness direction, and the drain contact and the channel have a circular cross-sectional hole in a center of a circular cross-section thereof along a plane perpendicular to the film thickness direction. In other words, the stacked channel and drain contact have a cross-section that resembles an empty or hollow circle along the plane perpendicular to a direction of film growth thereof.

In operation 504, gate dielectric layers are formed on sides of the drain contact and the channel. The gate dielectric layers have concentric circular cross-sections along the plane perpendicular to the film thickness direction. The circular cross-section of the drain contact has one circular cross-sectional portion of the gate dielectric layers in direct contact on either side thereof.

In operation 506, a source line is formed in a position below the channel in the film thickness direction. The source line is electrically coupled to a plurality of channels in a direction along the plane perpendicular to the film thickness direction.

In operation 508, gate layers are formed on sides of the gate dielectric layers, the gate layers having a lower surface at a level above an upper surface of the source line and a thickness coincident with a lower surface of the drain contact in the film thickness direction. An inner gate layer fills a hole through a center of a center concentric circular cross-section of the gate dielectric layers along the plane perpendicular to the film thickness direction, while an outer gate layer surrounds an outside concentric circular cross-section of the gate dielectric layers along the plane perpendicular to the film thickness direction.

In operation 510, an electrode is formed above the upper surface of the drain contact.

In operation 512, a fourth insulative layer is formed on sides of the gate layers, sides of the gate dielectric layers, and sides of the electrode along the plane perpendicular to the film thickness direction.

In various embodiments, the drain contact, electrode, source layer, and gate layers may include any suitable material, including doped polysilicon, W, TaN, TiNi, TiN, etc. Also, the channel may include Si, and the first masking layer, the second masking layer, the first insulative layer, the second insulative layer, the third insulative layer, and the gate dielectric layer may include any suitable material, such as $SiO_2$, SiON, $ZrO_2$, $HfO_2$, $Al_2O_3$, etc.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:
1. A method, comprising:
    forming a drain material above a substrate in a film thickness direction;
    forming and patterning a first masking layer above the drain material in the film thickness direction, the first masking layer being patterned to expose a portion of the drain material having a circular cross-section along a plane perpendicular to the film thickness direction;
    removing all portions of the drain material except for the exposed portion of the drain material and portions positioned directly therebelow in the film thickness direction using the first masking layer;
    removing the first masking layer during or after removal of the portions of the drain material;
    forming a first insulative layer above portions of the substrate not covered by the drain material to a thickness consistent with an upper surface of the drain material;
    forming a second insulative layer above the first insulative layer and the drain material in the film thickness direction to a desired thickness;
    placing the first masking layer above the second insulative layer aligned with previous placement of the first masking layer above the substrate to expose a portion of the second insulative layer having the circular cross-section along the plane perpendicular to the film thickness direction;
    removing the exposed portion of the second insulative layer to expose the upper surface of the drain material;
    removing the first masking layer during or after removal of the exposed portion of the second insulative layer;
    growing the second insulative layer along the plane perpendicular to the film thickness direction to shrink a diameter of a hole through the second insulative layer having the circular cross-section along the plane perpendicular to the film thickness direction;
    removing exposed portions of the drain material through the hole of the second insulative layer to form a drain contact having a circular cross-sectional hole in a center thereof along the plane perpendicular to the film thickness direction;
    removing the first insulative layer and the second insulative layer;
    removing portions of the substrate positioned directly below the drain contact to a desired level in the film thickness direction to form a channel having the circular cross-section with a hole in a center thereof along the plane perpendicular to the film thickness direction;
    forming gate dielectric layers above the drain contact and on sides of the drain contact and the channel, the gate dielectric layers having concentric circular cross-sections along the plane perpendicular to the film thickness direction, wherein the circular cross-section of the drain contact has one circular cross-sectional portion of the gate dielectric layers in direct contact on either side thereof;
    forming a source layer below the channel in the film thickness direction, the source layer being electrically coupled to the channel;
    forming and patterning a second masking layer above the gate dielectric layers positioned above the drain contact and above the hole in the center of the drain contact in the film thickness direction, wherein the second masking layer has a rectangular cross-section along the plane perpendicular to the film thickness direction that is positioned above a plurality of drain contacts;
    removing portions of the source layer and substrate not covered by the second masking layer in the film thickness direction to form a source line that is electrically coupled to a plurality of channels along the plane perpendicular to the film thickness direction;
    removing the second masking layer;
    forming a third insulative layer having a thickness in the film thickness direction that corresponds to a desired height of a lower surface of subsequently formed gate layers;
    forming the gate layers above the third insulative layer on sides of the gate dielectric layers to a thickness coincident with a lower surface of the drain contact in the film thickness direction, wherein an inner gate layer fills a hole through a center of a center concentric circular cross-section of the gate dielectric layers along the plane perpendicular to the film thickness direction, and wherein an outer gate layer surrounds an outside concentric circular cross-section of the gate dielectric layers along the plane perpendicular to the film thickness direction;

removing an upper portion of the gate dielectric layers above the drain contact to expose an upper surface of the drain contact;

forming an electrode above the upper surface of the drain contact; and forming a fourth insulative layer above the third insulative layer and the gate layers in the film thickness direction, and along sides of the electrode along the plane perpendicular to the film thickness direction.

2. The method as recited in claim 1, wherein forming the source layer comprises doping the substrate with ions to form an n+ doped polysilicon material.

3. The method as recited in claim 1, further comprising:
planarizing the fourth insulative layer and the electrode; and
forming a perpendicular magnetic tunnel junction (pMTJ) above the electrode.

4. The method as recited in claim 3, wherein forming the pMTJ comprises:
forming a seed layer above the electrode in the film thickness direction;
forming an underlayer above the seed layer in the film thickness direction;
forming a synthetic antiferromagnetic (SAF) seed layer above the underlayer in the film thickness direction;
forming a first SAF layer above the SAF seed layer in the film thickness direction;
forming a spacer layer above the first SAF layer in the film thickness direction;
forming an antiferromagnetic (AFM) coupling layer above the spacer layer in the film thickness direction;
forming a second SAF layer above the AFM coupling layer in the film thickness direction;
forming a ferromagnetic (FM) coupling layer above the second SAF layer in the film thickness direction;
forming a reference layer above the FM coupling layer in the film thickness direction;
forming a barrier layer above the reference layer in the film thickness direction;
forming a free layer above the barrier layer in the film thickness direction; and
forming at least one cap layer above the free layer in the film thickness direction.

5. The method as recited in claim 1,
wherein the drain material comprises at least one material selected from a group consisting of: W, TaN, TiNi, and TiN,
wherein the channel comprises Si,
wherein the first masking layer, the second masking layer, the first insulative layer, the second insulative layer, the third insulative layer, and the gate dielectric layer each comprises at least one material selected from a group consisting of: $SiO_2$, SiON, $ZrO_2$, $HfO_2$, and $Al_2O_3$,
wherein the electrode comprises at least one material selected from a group consisting of: W, TaN, TiNi, and TiN,
wherein the source layer comprises at least one material selected from a group consisting of: doped polysilicon, W, TaN, TiNi, and TiN, and wherein the gate layers each comprises at least one material selected from a group consisting of: doped polysilicon, W, TaN, TiNi, and TiN.

6. The method as recited in claim 1, wherein the gate layers are electrically insulated from the channel, the drain contact, and the source line.

7. A method, comprising:
forming a drain contact and a channel, wherein the drain contact is positioned above the channel in a film thickness direction, and wherein the drain contact and the channel have a circular cross-sectional hole in a center of a circular cross-section thereof along a plane perpendicular to the film thickness direction;
forming gate dielectric layers on sides of the drain contact and the channel, the gate dielectric layers having concentric circular cross-sections along the plane perpendicular to the film thickness direction, wherein the circular cross-section of the drain contact has one circular cross-sectional portion of the gate dielectric layers in direct contact on either side thereof;
forming a source line positioned below the channel in the film thickness direction, wherein the source line is electrically coupled to a plurality of channels in a direction along the plane perpendicular to the film thickness direction;
forming gate layers on sides of the gate dielectric layers, the gate layers having a lower surface at a level above an upper surface of the source line and a thickness coincident with a lower surface of the drain contact in the film thickness direction, wherein an inner gate layer fills a hole through a center of a center concentric circular cross-section of the gate dielectric layers along the plane perpendicular to the film thickness direction, and wherein an outer gate layer surrounds an outside concentric circular cross-section of the gate dielectric layers along the plane perpendicular to the film thickness direction;
forming an electrode above the upper surface of the drain contact; and
forming a fourth insulative layer on sides of the outer gate layers, sides of the gate dielectric layers, and sides of the electrode along the plane perpendicular to the film thickness direction.

8. The method as recited in claim 7, wherein forming the drain contact comprises:
forming a drain material above a substrate in the film thickness direction;
forming and patterning a first masking layer above the drain material in the film thickness direction, the first masking layer being patterned to expose a portion of the drain material having a circular cross-section along the plane perpendicular to the film thickness direction;
removing all portions of the drain material except for the exposed portion of the drain material and portions positioned directly therebelow in the film thickness direction using the first masking layer;
removing the first masking layer during or after removal of the portions of the drain material;
forming a first insulative layer above portions of the substrate not covered by the drain material to a thickness consistent with an upper surface of the drain material;
forming a second insulative layer above the first insulative layer and the drain material in the film thickness direction to a desired thickness;
placing the first masking layer above the second insulative layer aligned with previous placement of the first masking layer above the substrate to expose a portion of the second insulative layer having the circular cross-section along the plane perpendicular to the film thickness direction;

removing the exposed portion of the second insulative layer to expose the upper surface of the drain material;

removing the first masking layer during or after removal of the exposed portion of the second insulative layer;

growing the second insulative layer along the plane perpendicular to the film thickness direction to shrink a diameter of a hole through the second insulative layer having the circular cross-section along the plane perpendicular to the film thickness direction; and removing exposed portions of the drain material through the hole of the second insulative layer.

9. The method as recited in claim 8, wherein forming the channel comprises:

removing the first insulative layer and the second insulative layer; and removing portions of the substrate positioned directly below the drain contact to a desired level in the film thickness direction to form the channel.

10. The method as recited in claim 8, wherein forming the source line comprises:

forming a source layer below the channel in the film thickness direction by doping the substrate with ions to form an n+ doped polysilicon material, the source layer being electrically coupled to the channel;

forming and patterning a second masking layer above the gate dielectric layers positioned above the drain contact and above the hole in the center of the drain contact in the film thickness direction, wherein the second masking layer has a rectangular cross-section along the plane perpendicular to the film thickness direction that is positioned above a plurality of drain contacts; and removing portions of the source layer and substrate not covered by the second masking layer in the film thickness direction to form the source line.

11. The method as recited in claim 10, wherein forming the gate layers comprises:

removing the second masking layer;

forming a third insulative layer having a thickness in the film thickness direction that corresponds to a desired height of a lower surface of the gate layers;

forming the gate layers above the third insulative layer on the sides of the gate dielectric layers; and removing an upper portion of the gate dielectric layers above the drain contact to expose an upper surface of the drain contact.

12. The method as recited in claim 11, wherein the drain material comprises at least one material selected from a group consisting of: W, TaN, TiNi, and TiN, wherein the channel comprises Si, wherein the first masking layer, the second masking layer, the first insulative layer, the second insulative layer, the third insulative layer, and the gate dielectric layer each comprises at least one material selected from a group consisting of: $SiO_2$, SiON, $ZrO_2$, $HfO_2$, and $Al_2O_3$, wherein the electrode comprises at least one material selected from a group consisting of: W, TaN, TiNi, and TiN, wherein the source layer comprises at least one material selected from a group consisting of: doped polysilicon, W, TaN, TiNi, and TiN, and wherein the gate layers each comprises at least one material selected from a group consisting of: doped polysilicon, W, TaN, TiNi, and TiN.

13. The method as recited in claim 7, further comprising:

planarizing the fourth insulative layer and the electrode; and forming a perpendicular magnetic tunnel junction (pMTJ) above the electrode.

14. The method as recited in claim 13, wherein forming the pMTJ comprises:

forming a seed layer above the electrode in the film thickness direction;

forming an underlayer above the seed layer in the film thickness direction;

forming a synthetic antiferromagnetic (SAF) seed layer above the underlayer in the film thickness direction;

forming a first SAF layer above the SAF seed layer in the film thickness direction;

forming a spacer layer above the first SAF layer in the film thickness direction;

forming an antiferromagnetic (AFM) coupling layer above the spacer layer in the film thickness direction;

forming a second SAF layer above the AFM coupling layer in the film thickness direction;

forming a ferromagnetic (FM) coupling layer above the second SAF layer in the film thickness direction;

forming a reference layer above the FM coupling layer in the film thickness direction;

forming a barrier layer above the reference layer in the film thickness direction;

forming a free layer above the barrier layer in the film thickness direction; and forming at least one cap layer above the free layer in the film thickness direction.

15. The method as recited in claim 7, wherein the gate layers are electrically insulated from the channel, the drain contact, and the source line.

* * * * *